US011228416B1

(12) United States Patent
Huss et al.

(10) Patent No.: US 11,228,416 B1
(45) Date of Patent: Jan. 18, 2022

(54) CLOCK CALIBRATION FOR DATA SERIALIZER

(71) Applicant: Cadence Design Systems, Inc., San Jose, CA (US)

(72) Inventors: Scott David Huss, Cary, NC (US); Loren B. Reiss, Raleigh, NC (US); Christopher George Moscone, Cary, NC (US); James Dennis Vandersand, Jr., Chapel Hill, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/944,036

(22) Filed: Jul. 30, 2020

(51) Int. Cl.
*H03K 5/01* (2006.01)
*H04L 7/00* (2006.01)
*H03K 5/00* (2006.01)

(52) U.S. Cl.
CPC ............. *H04L 7/0012* (2013.01); *H03K 5/01* (2013.01); *H04L 7/0091* (2013.01); *H03K 2005/00058* (2013.01)

(58) Field of Classification Search
CPC .......... G06F 11/10; G06F 13/20; G06F 13/40; G06F 17/40; H03D 3/24; H03K 5/01; H03K 3/3562; H03K 19/00; H03K 2005/005; H03M 1/10; H03M 9/00; H03M 13/00; H03M 13/03; H04L 1/00; H04L 7/00; H04L 7/04; H04L 7/033; H04L 7/0012; H04L 7/0091; H04L 25/03; H04L 25/40
USPC ........ 341/101, 120; 375/358, 371, 375, 376; 702/187; 711/167
See application file for complete search history.

(56) References Cited

U.S. PATENT DOCUMENTS

| 2012/0179422 A1* | 7/2012 | Webb, III | G01R 31/31725 702/187 |
| 2013/0346721 A1* | 12/2013 | Giovannini | G11C 29/028 711/167 |
| 2016/0241249 A1* | 8/2016 | Balamurugan | H03L 7/00 |

* cited by examiner

*Primary Examiner* — Shawkat M Ali
(74) *Attorney, Agent, or Firm* — Schwegman Lundberg & Woessner, P.A.

(57) ABSTRACT

Various embodiments provide for calibrating one or more clock signals for a serializer, which can be used with a circuit for data communications, such as serializer/deserializer (SerDes) communications. In particular, for a serializer operating based on a plurality of clock signals, some embodiments provide for calibration of one or more of the plurality of clock signals by adjusting a duty cycle of one or more clock signals, a delay of one or more clock signals, or both.

20 Claims, 17 Drawing Sheets

CLOCK CALIBRATION FOR DATA SERIALIZER

TECHNICAL FIELD

Embodiments described herein relate to data communications and, more particularly, to clock signal calibration for a data serializer, which can be used with a circuit.

BACKGROUND

Digital communication transmitters, such as ones that use a data serializer (hereafter, serializer), often use multiple clock signals (e.g., quarter-rate clock signals) to facilitate transmission of data to a digital communications receiver. During a calibration process, a given transmitter may adjust different parameters of those clock signals to ensure proper operation of the transmitter. For instance, a transmitter can perform a calibration process to adjust the delay between two or more different clock signals or to adjust a duty cycle of an individual clock signal.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
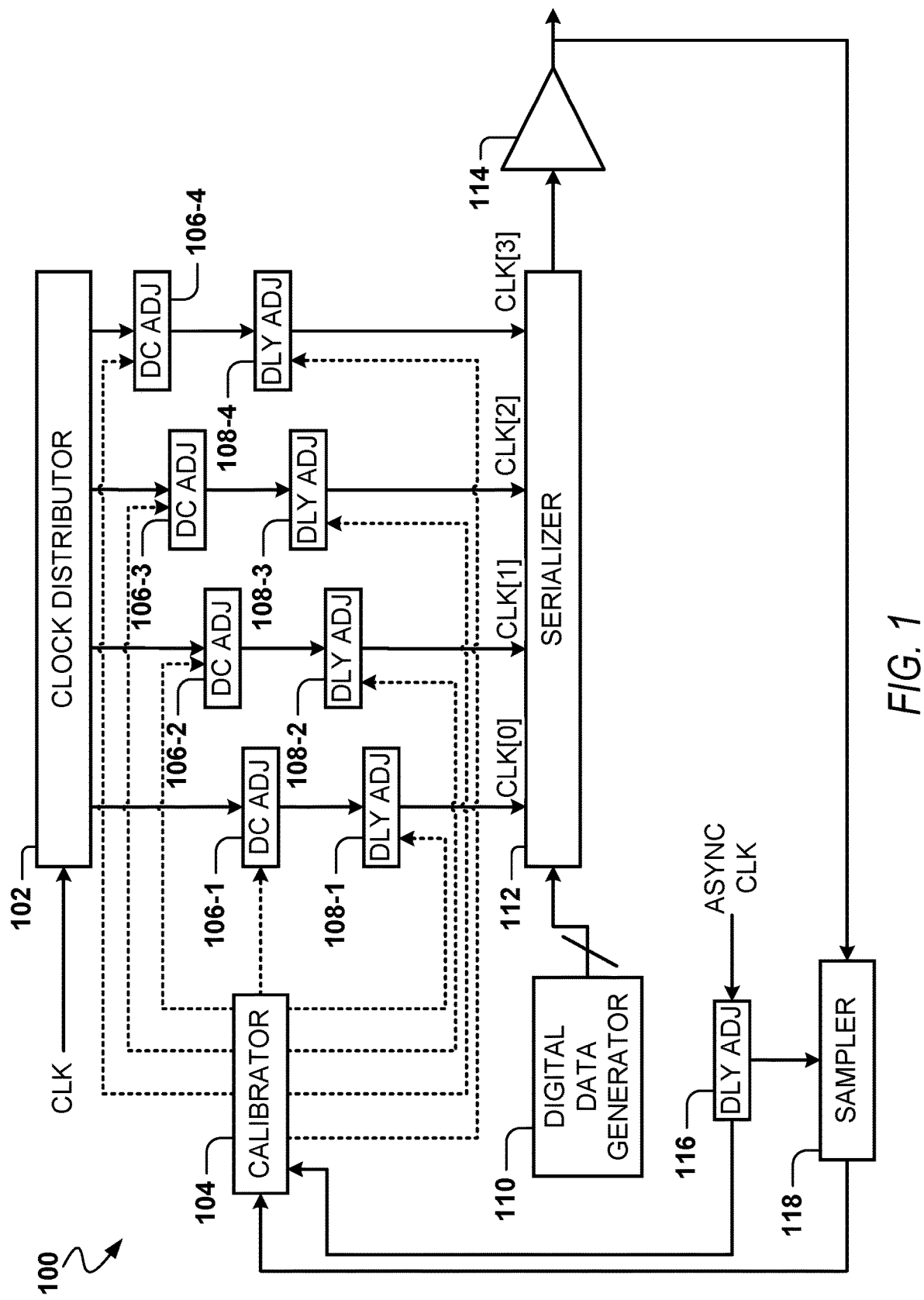
FIG. 1 is a schematic illustrating an example circuit that implements clock calibration for a serializer, in accordance with various embodiments.

Various embodiments provide for calibrating one or more clock signals for a serializer, which can be used with a circuit for data communications, such as serializer/deserializer (SerDes) communications. In particular, for a serializer operating based on (e.g., using) a plurality of clock signals (e.g., quarter-rate clock signals), some embodiments provide for calibration of one or more of the plurality of clock signals. Various embodiments can be used to calibrate one or more clock signals for a serializer that is coupled to a deserializer, where the serializer and the deserializer are disposed on a circuit die (e.g., of an integrated circuit). Depending on the embodiment, calibration of an individual clock signal for a serializer can comprise adjusting the duty cycle of the individual clock signal, adjusting the delay (e.g., phase delay) of the individual clock signal, or a combination of both. Additionally, each individual clock signal can be independently calibrated by adjusting a duty cycle of the individual clock signal, adjusting a delay of the individual clock signal, or both.

Some embodiments can be used to adjust a duty cycle of an individual clock signal (e.g., each high-speed analog clock signal) of a plurality of clock signals that clock a serializer. For example, to calibrate an individual clock signal, the duty cycle can be adjusted to target a duty cycle of 50% (e.g., to be as close to an ideal 50% duty cycle as possible). In other examples, the duty cycle is adjusted to another target value, such 25% or 75% (which can be facilitated by setting the number of 1's to be observed/targeted to 25% or 75% respectively). According to some embodiments, a set of data patterns (e.g., unique 32-bit data patterns) is generated and outputted to a serializer during adjustment (e.g., calibration) of the duty cycle of one or more individual clock signals that are clocking the serializer, and the serializer outputs the set of data patterns to a driver (e.g., analog driver). For some embodiments, each data pattern is generated and provided to the serializer for the specific adjustment (e.g., calibration) of the duty cycles of a specific set of individual clock signals (e.g., specific data pattern to adjust the duty cycle of clock signals one at a time). The data pattern can be selected based on the understanding that the serializer drives 1's on the rising edge of individual clock signals, and 0's on the falling edge of individual clock signals. Alternatively, some embodiments use a different data pattern that does not have the same clocking to data relationship. For some embodiments, a data sampler (e.g., built-in-test sampler) samples the output from the serializer, and generates sample data based on the sampled output. The data pattern can be selected such that the control is orthogonal (e.g., a single control affects only a single clock signal). Additionally, the data pattern can be selected such that 50% duty cycle can be achieved with respect to one or more of the clock signals. With the 50% duty cycle, mis-calibration due to intersymbol interference (ISI) may be avoided. Depending on the embodiment, the data pattern for a duty cycle adjustment (e.g., calibration) can comprise 1100 patterns, which can cause a select clock signal to be transmitted on the output of the serializer. The sampled data can be provided to a calibrator (e.g., a duty cycle calibration module), which controls the duty cycle adjustment of individual clock signals based on the sampled data (e.g., generating calibration codes that control the duty cycle of each clock signal). For instance, each duty cycle adjustment of an individual clock signal can be controlled by two parallel calibration codes (e.g., plus and minus).

For some embodiments, the data sampler is clocked by a clock signal that is asynchronous or pseudo-asynchronous (e.g., different in frequency) from the clock signals that are used by the serializer. By using an asynchronous clock signal, the data sampler can sample random points in the output of the serializer, which can facilitate duty cycle adjustments based on a difference in the number of sampled 1's and 0's (e.g., when 50% duty cycle is achieved, the same number of 1's and 0's will be sampled, or when 25% duty cycle is achieved, 25% 1's will be sampled).

Some embodiments can be used to adjust (e.g., calibrate) a delay of an individual clock signal (e.g., each high-speed analog clock signal) of a plurality of clock signals that clock a serializer. For example, to calibrate an individual clock signal, the one or more individual clock signals is delayed to calibrate phase relationships between the individual clock signals such that they are as close as possible to having equal phase relationships relative to each other. According to some embodiments, a set of data patterns (e.g., unique 32-bit data patterns) is generated and outputted to a serializer during adjustment (e.g., calibration) of the delay (e.g., phase delay) between two or more individual clock signals that are clocking the serializer, and the serializer outputs the set of data patterns to a driver (e.g., analog driver). Thought various embodiments describe use of a driver, for some embodiments For some embodiments, each data pattern is generated and provided to the serializer for the specific adjustment (e.g., calibration) of the delay between a specific set of individual clock signals (e.g., specific data pattern to adjust the delay of clock signals one at a time). As noted herein, the data pattern can be selected based on the understanding that the serializer drives 1's on the rising edge of individual clock signals, and 0's on the falling edge of individual clock signals. For some embodiments, a data sampler (e.g., built-in-test sampler) samples the output from the serializer, and generates sample data based on the sampled output. The sampled data can be provided to a calibrator (e.g., a delay calibration module), which controls the delay adjustment of individual clock signals based on the sampled data (e.g., generating calibration codes that control delay between clock signals).

As used herein, a data serializer (or serializer) comprises a hardware-implemented component that converts parallel data to serial data. For example, a serializer can receive data via a parallel data interface, convert the received data into a serial data output stream, and output the serial data output stream via a serial data interface. A serializer can be paired with a deserializer, which is configured to convert serial data to parallel data. For instance, the deserializer can receive a serial data output stream, convert the serial data output stream to parallel data, and output the parallel data via a parallel data interface. A serializer and deserializer pair can be used to implement a SerDes communications system, where the serializer of the pair can form part of the transmitter and the deserializer of the pair can form part of the receiver.

For some embodiments, duty cycles of a plurality of clock signals are adjusted (e.g., calibrated) prior to the delays of the plurality of clocks signals being adjusted (e.g., calibrated). In doing so, various embodiments can ensure that the falling edges and the rising edges of the plurality of the clock signals can be locked.

By using one or more selected data patterns and asynchronous data sampling of data transmitted from a serializer, various embodiments allow for distortions in duty cycle, phase delay, or both to be observable by a calibrator (e.g., a calibration module) that perform calibration functions (e.g., duty cycle or delay calibration functions) with respect to clock signals that clock the serializer. For example, based on the sample data, the calibrator can generate calibration codes that allow duty cycle, delay, or both to be adjusted for individual clock signals clocking the serializer. By sampling the output of the serializer (e.g., transmitter) to perform calibration functions rather than sampling the clock signals directly, various embodiments can eliminate distortion caused by the serializer and/or driver (e.g., distortion due to delay mismatch duty cycle distortion) and delay in the clocks.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a schematic illustrating an example circuit 100 that implements clock calibration for a serializer 112, in accordance with various embodiments. Depending on the embodiment, the circuit 100 can form part of a larger circuit, such as a circuit for data communications (e.g., SerDes communication). As shown, the circuit 100 comprises a clock distributor 102, a clock calibrator 104 (hereafter, the calibrator 104), a plurality of duty cycle adjusters 106-1, 106-2, 106-3, 106-4 (hereafter, collectively referred to as duty cycle adjusters 106), a plurality of delay adjusters 108-1, 108-2, 108-3, 108-4 (hereafter, collectively referred to as delay adjusters 108), a digital data generator 110, the serializer 112, a driver 114, a delay adjuster 116, and a data sampler (hereafter, the sampler 118). Each of the duty cycle adjusters 106 and the delay adjusters 108 represents a signal adjuster of the circuit 100 for applying a signal adjustment based on data provided by the calibrator 104. The duty cycle adjusters 106 are coupled to outputs of clock distributor 102, the delay adjusters 108 are coupled to outputs of the duty cycle adjusters 106, the serializer 112 is coupled to an output of the digital data generator 110 and to outputs of the delay adjusters 108, the driver 114 is coupled to an output of the serializer 112, the sampler 118 is coupled to an output of the delay adjuster 116 and an output of the driver 114, the calibrator 104 is coupled to an output of the delay adjuster 116 and an output of the sampler 118.

For some embodiments, the clock distributor 102 receives a clock signal (e.g., reference clock signal) and generates four clock signals (e.g., four analog clock signals), with each of the duty cycle adjusters 106 receiving a different individual clock signal. For example, the four clock signals generated can comprise quarter-rate clock signals (e.g., four clock signals are quadrature regarding their phase relationship). The four clock signals can comprise high-speed clock signals. As shown, after passing through the duty cycle adjusters 106 and the delay adjusters 108, the four clock signals are provided to the serializer 112 to facilitate (e.g., clock) its operation. Though various embodiments are described herein with respect to four clock signals, for some embodiments the number clock signals being generated and adjusted can be less than four clock signals (e.g., a single clock signal) or more than four clock signals (e.g., eight clock signals).

The digital data generator 110 of some embodiments generates digital data and outputs the digital data as parallel digital data. For example, the digital data generator 110 can comprise a parallel data output interface for outputting the parallel digital data. For some embodiments, the digital data generator 110 generates and outputs (to the serializer 112) one or more data patterns that facilitate adjustment (e.g., calibration) of duty cycle of one or more individual clock signals via the duty cycle adjusters 106, delay of one or more individual clock signals via the delay adjusters 108, or both. For instance, the digital data generator 110 can implement, at least in part, a data pattern generator that enables generation of the one or more data patterns.

According to some embodiments, during a duty cycle calibration of a first clock signal of the plurality of clock signals (provided by the clock distributor 102), the parallel digital data generated by the digital data generator 110 comprises a first data pattern (e.g., that causes selection of the first clock signal as output of the serializer 112). During the duty cycle calibration of the first clock signal, the calibrator 104 generates a first calibration data portion (e.g., first calibration code) for a first individual duty cycle adjuster of the duty cycle adjusters 106 that receives the first clock signal. As described herein, the first individual duty cycle adjuster can be configured to adjust a duty cycle of the first clock signal based on the first calibration data portion. During a duty cycle calibration of another (second) clock signal of the plurality of clock signals (provided by the clock distributor 102), the parallel digital data generated by the digital data generator 110 can comprise a second data pattern (e.g., that causes selection of the second clock signal as output of the serializer 112). During the duty cycle calibration of the second clock signal, the calibrator 104 generates a second calibration data portion (e.g., second calibration code) for a second individual duty cycle adjuster of the duty cycle adjusters 106 that receives the second clock signal. As described herein, the second individual duty cycle adjuster can be configured to adjust a duty cycle of the second clock signal based on the second calibration data portion.

For various embodiments, the duty cycle calibration of any of the plurality of clock signals has a target duty cycle of 50%. Alternatively, the target duty cycle can be another value, such as 25% or 75%. Additionally, for some embodiments, a duty cycle calibration is performed for each clock signal that is being received by the serializer 112.

For some embodiments, during a delay calibration between a first clock signal and a second clock signal of the plurality of clock signals (provided by the clock distributor 102), the parallel digital data generated by the digital data generator 110 comprises a first data pattern (e.g., that causes selection of the first and second clock signals as output of the serializer 112). During the delay calibration between the first clock signal and the second clock signal of the plurality of clock signals, calibrator 104 generates a first calibration data portion (e.g., first calibration code) for a first individual delay adjuster of the delay adjusters 108 that receives the first clock signal, and generates a second calibration data portion (e.g., second calibration code) for a second individual delay adjuster of the delay adjusters 108 that receives the second clock signal. For instance, the first calibration data portion can be configured to increase the delay of the first clock signal, and the second calibration data portion can be configured to decrease the delay of the second clock signal. Alternatively, the first calibration data portion can be configured to decrease the delay of the first clock signal, and the second calibration data portion can be configured to increase the delay of the second clock signal. In this way, various embodiments can the adjust the delay (e.g., phase delay) between the first and second clock signals by spreading (e.g., splitting) the delay adjustments to both clock signals. As described herein, the first individual delay adjuster can be configured to adjust a delay of the first clock signal based on the first calibration data portion, and the second individual delay adjuster can be configured to adjust a delay of the second clock signal based on the second calibration data portion.

For some embodiments, a delay calibration comprises one or more phases of adjusting delays between different pairings of clock signals that are being received by the serializer 112 (e.g., where the number of phases performed is one less than the number of clock signals).

For some embodiments, the serializer 112 receives parallel digital data (e.g., having a data width of 32-bit) from the digital data generator 110 and the four clock signals from the delay adjusters 108, and generates serialized digital data based on the parallel digital data and the four clock signals. For example, the serializer 112 can convert the parallel digital data to the serialized digital data using the four clock signals. For some embodiments, the serializer 112 is implemented by a plurality of serializers coupled in series. For instance, the serializer 112 can comprise an 8-to-1 serializer and a 4-to-1 serializer coupled to output of the 8-to-1 serializer, where: the 8-to-1 serializer receives the parallel digital data (e.g., having a data width of 32-bits) from the digital data generator 110 and generates second parallel digital data (e.g., having a width of 4-bits); and the 4-to-1 serializer receives the second parallel digital data and generates serialized digital data (e.g., having a data width of 1-bit). Additionally, for some embodiments, the serializer 112 comprises a parallel input interface for receiving the parallel digital data, and a serial data output interface for outputting the serialized digital data. For some embodiments, the serializer 112 uses rising clock signal edges to generate rising edges at the serial data output interface of the serializer 112, and uses falling clock signal edges to generate falling edges at the serial data output interface of the serializer 112.

The driver 114 of some embodiments receives serialized digital data from the serializer 112, and generates an amplified output signal based on the serialized digital data. For example, the driver 114 can comprise an analog driver. For various embodiments, the amplified output signal is intended to be received by a deserializer (not shown) of a SerDes communication system. Accordingly, the driver 114 can serve as a driver for a data transmitter.

For some embodiments, the data sampler 118 receives the amplified output signal from the driver 114, receives an asynchronous clock signal through the delay adjuster 116, samples the amplified output signal at multiple (e.g., random) points based on the asynchronous clock signal, and generates (and outputs) sample data based on the sampling. Alternatively, and the data sampler 118 receive the output signal at multiple (e.g., random) points based on the asynchronous clock signal, and generates (and outputs) sample data based on the sampling. For some embodiments, the data sampler 118 comprises a sampler latch.

The calibrator 104 of some embodiments receives the sample data from the sampler 118, receives the asynchronous clock signal through the delay adjuster 116, and generates calibration data based on the sample data and the asynchronous clock signal. For some embodiments, portions of the calibration data are provided to the duty cycle adjusters 106 and the delay adjusters 108.

For example, a portion of the calibration data generated by the calibrator 104 is configured to cause one or more of the duty cycle adjusters 106 to adjust the duty cycle of the respective clock signals received from the clock distributor 102. The calibration data can comprise one or more calibration codes for the duty cycle adjusters 106 (e.g., a first calibration code for the duty cycle adjuster 106-1, a second calibration code for the duty cycle adjuster 106-2, a third calibration code for the duty cycle adjuster 106-3, and a fourth calibration code for the duty cycle adjuster 106-4). For example, a calibration code generated for a given duty cycle adjuster can comprise a range of plus calibration codes that correspond to positive duty cycle skew adjustments and a range of minus calibration codes that correspond to negative duty cycle skew adjustments. During duty cycle calibration of two of the four clock signals, the calibrator 104 can generate and output two parallel calibration codes (e.g., plus and minus) to the duty cycle adjusters 106 associated with the two clock signals.

Additionally, a portion of the calibration data generated by the calibrator 104 is configured to cause one or more of the delay adjusters 108 to adjust the delay of the respective clock signals received from the duty cycle adjusters 106. The calibration data can comprise one or more calibration codes for the delay adjusters 108 (e.g., a first calibration code for the delay adjuster 108-1, a second calibration code for the delay adjuster 108-2, a third calibration code for the delay adjuster 108-3, and a fourth calibration code for the delay adjuster 108-4). For example, a calibration code generated for a given delay adjuster can comprise 62 values that correspond to delaying a clock signal received by the given delay adjuster by +/−31 units of time relative to a nominal position. During delay calibration between two of the four clock signals, the delay adjustment can be spread between the two clock signals. For example, the calibrator 104 can generate and output calibration codes for (e.g., calibration code that is split between) the two delay adjusters (of the delay adjusters 108) that receive the two clock signals to spread the delay adjustment between the two clock signals. Accordingly, where the delay (e.g., phase delay) between a first clock signal and a second clock signal needs to be adjusted by 5 units, the delay of the first clock signal can be adjusted (via a respective one of the delay adjusters 108) by +3 units and the delay of the second clock signal can be adjusted (via another one of the delay adjusters 108) by −2 units.

The asynchronous clock signal is different from each of the four clock signals generated and outputted by the clock distributor 102, which enables the sampler 118 to sample the amplified output signal from the driver 114 at multiple, random points and enables the calibrator 104 to adjust the four clock signals based on the sample data from the sampler 118. Depending on the embodiment, the asynchronous clock signal has a different frequency from each of the four clock signals, has a different phase from each of the four clock signals, or both. The delay adjuster 116 can adjust the delay (e.g., phase delay) of the asynchronous clock signal prior to it being received by the calibrator 104 and the sampler 118.

For some embodiments, each of the duty cycle adjusters 106 receives a portion of calibration data (e.g., calibration code), receives a clock signal from the clock distributor 102, and adjusts the duty cycle of the received clock signal based on the portion of calibration data. For example, one of the duty cycle adjusters 106 can apply a duty cycle skew adjustment to a received clock signal based on the portion of calibration data (e.g., calibration code) received from the calibrator 104. By providing specific calibration data (e.g., a specific calibration code) to individual ones of the duty cycle adjusters 106, various embodiments can independently apply adjustments to the duty cycle of clock signals.

For some embodiments, each of the delay adjusters 108 receives a portion of calibration data (e.g., calibration code), receives a clock signal from respective ones of the duty cycle adjusters 106, and adjusts the delay of the received clock signal based on the portion of calibration data. For example, one of the delay adjusters 108 can apply a delay skew adjustment to a received clock signal based on the portion of calibration data (e.g., calibration code) received from the calibrator 104. By providing specific calibration data (e.g., a specific calibration code) to individual ones of the delay adjusters 108, various embodiments can independently apply adjustments to the delay of clock signals.

Figure 2:
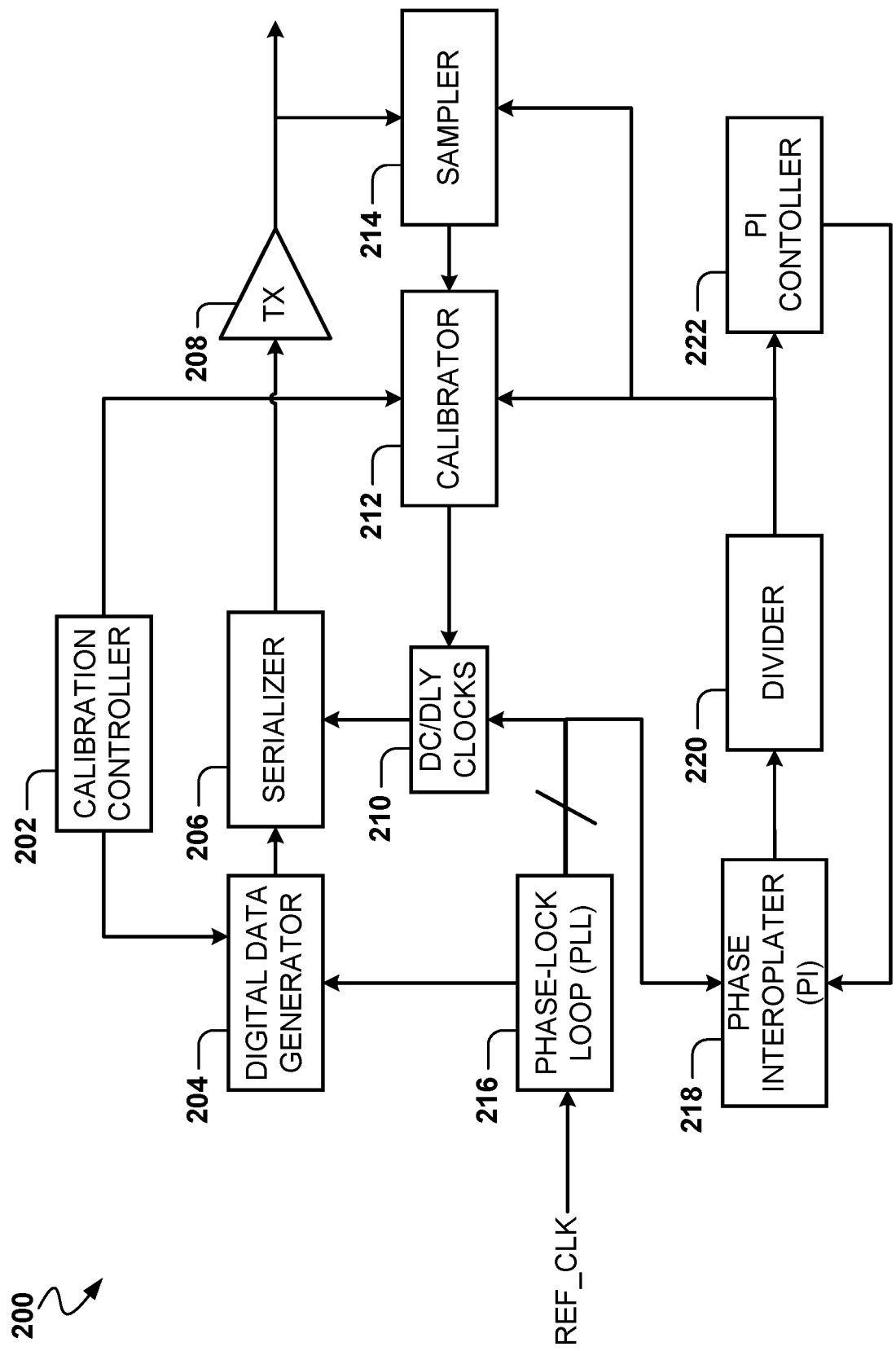
FIG. 2 is a schematic illustrating an example circuit that implements clock calibration for a serializer, in accordance with various embodiments.

FIG. 2 is a schematic illustrating an example circuit 200 that implements clock calibration for a serializer 206, in accordance with various embodiments. In particular, the circuit 200 illustrates an example of how an asynchronous or pseudo-asynchronous clock signal can be generated to facilitate clock calibration for the serializer 206. As shown, the circuit 200 comprises a calibration controller 202, a digital data generator 204, the serializer 206, a driver 208, a data sampler 214 (hereafter, the sampler 214), a clock calibrator 212 (hereafter, the calibrator 212), a phase-lock loop (PLL) 216, a phase interpolator (PI) 218, a divider 220, and a phase interpolator (PI) controller 222. According to some embodiments, the digital data generator 204 is similar to the digital data generator 110, the serializer 206 is similar to the serializer 112, the driver 208 is similar to the driver 114, the sampler 214 is similar to the sampler 118, and the calibrator 212 is similar to the calibrator 104 described with respect to FIG. 1. As also shown, the PI 218 is coupled to an output of the PLL 216, the divider 220 is coupled to an output of the PI 218, each of the calibrator 212, the sampler 214, and the PI controller 222 is coupled to an output of the divider 220, and the PI 218 is also coupled to an output of the PI controller 222.

During operation, the PLL 216 can receive a reference clock signal, generate a plurality of clock signals (e.g., four quarter-rate clock signals) based on the reference clock signal, and generate a clock signal (e.g., FUI/32) for the digital data generator 204. In FIG. 2, duty cycle/delay adjusted clock signals 210 (DC/DLY clock signals 210) represent the plurality of clock signals generated by the PLL 216 and after being adjusted in accordance with calibration data generated by the calibrator 212 (as described herein). As shown, the DC/DLY clock signals 210 are eventually provided to the serializer 206, where the DC/DLY clock signals 210 can drive operation of the serializer 206. For some embodiments, the calibration controller 202 controls operation of the digital data generator 204 and the calibrator 212 to facilitate adjustments (e.g., calibration) of one or more of the DC/DLY clock signals 210 as described herein. For some embodiments, the DC/DLY clock signals 210 can represent the clock signals provided by the clock distributor 102 via the duty cycle adjusters 106 and the delay adjusters 108 illustrated in FIG. 1.

In FIG. 2, the plurality of clock signals generated by the PLL 216 are also provided to the PI 218, which can facilitate generation of the asynchronous/pseudo-asynchronous clock signal used by the calibrator 212 and the sampler 214 in accordance with various embodiments. For some embodiments, the PI 218 has high jitter, which can result in an asynchronous/pseudo-asynchronous clock signal that facilitates better sampling resolution by the sampler 214. Additionally, for some embodiments, the PI 218 has a step size that facilitates sufficient resolution by the sampler 214. For instance, the PI 218 can update at full unit interval (FUI) of 64 (FUI/64) and can have a step size of $1/16$ unit interval (UI). This can enable the sampler 214 to sample at a frequency of (FUI/64)*(1+/−1/(64*16*2)) (e.g., assuming PI updates on every other clock cycle). For some embodiments, the PI 218 is stepped every other clock cycle.

The divider 220 can receive an interpolated clock signal generated by the PI 218, and generates a divided clock signal based on the interpolated clock signal. For some embodiments, this divided clock signal represents the asynchronous/pseudo-asynchronous clock signal that is used by each of the calibrator 212 and the sampler 214. For various embodiments, the PI controller 222 facilitates feedback adjustment of the PI 218 based on the divided clock signal generated by the divider 220.

Figure 3:
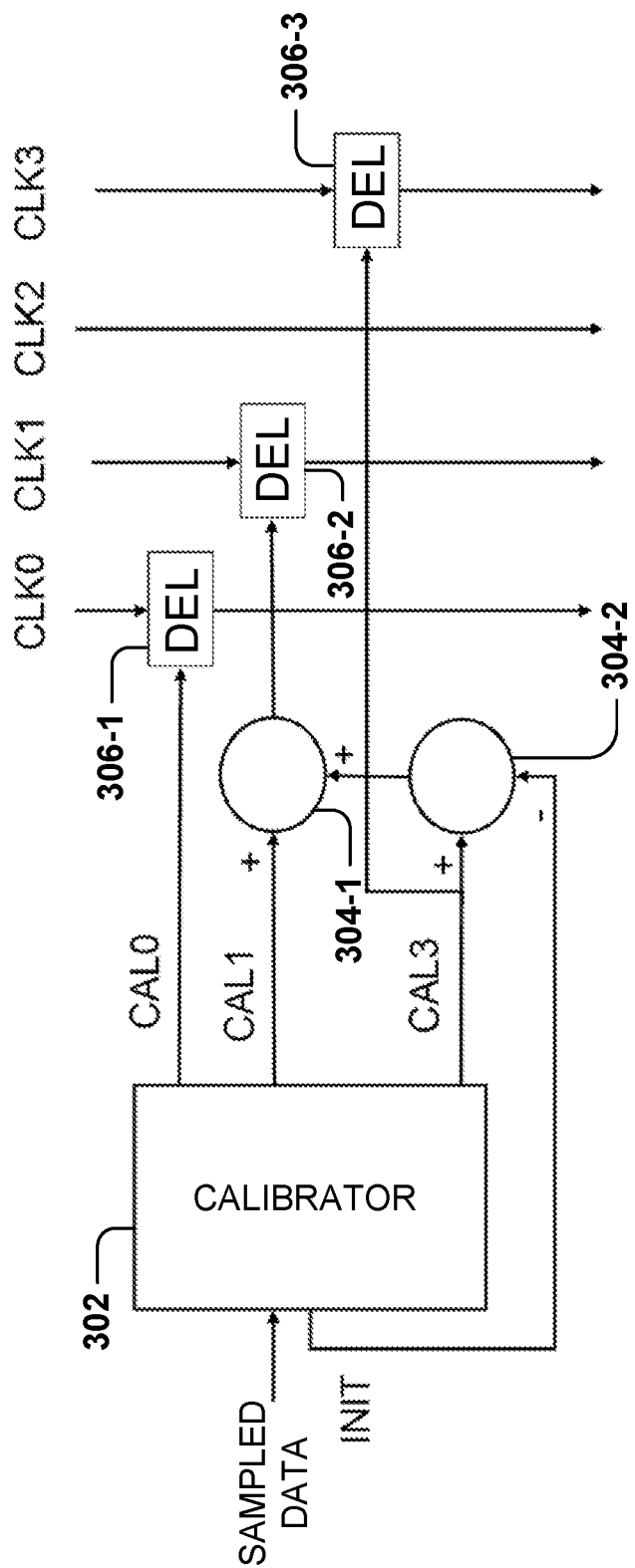
FIG. 3 is a block diagram illustrating an example of adjusting delays of a plurality of clock signals, in accordance with various embodiments.

FIG. 3 is a block diagram illustrating an example of adjusting delays of a plurality of clock signals, in accordance with various embodiments. In particular, FIG. 3 illustrates delay adjustments to four clock signals where the delay for one of the clock signals (clock signal 2) is fixed, and the delays of the other clock signals (clock signal 0, clock signal 1, and clock signal 3) are adjustable based on calibration data generated by a clock calibrator 302. For some embodiments, the calibrator 302 is similar to the calibrator 104 described with respect to FIG. 1. As shown, the clock calibrator 302 (hereafter, the calibrator 302) is coupled to the delay adjusters 306-1, 306-2, 306-3, the delay adjuster 306-1 receives clock signal 0, the delay adjuster 306-2 receives clock signal 1, and the delay adjuster 306-3 receives clock signal 3. The calibrator 302 generates calibration data CAL0 (e.g., calibration code 0) for the delay adjuster 306-1, calibration data CAL1 (e.g., calibration code 1) for the delay adjuster 306-2, and calibration data CAL3 (e.g., calibration code 3) for the delay adjuster 306-3.

As also shown, the delay of the clock signal 2 remains fixed. Calibration data CAL0 directly controls the delay adjuster 306-1. Calibration data CAL3 directly controls the delay adjuster 306-3. The calibration data that controls the delay adjuster 306-2 is generated by: subtracting (via subtraction component 304-2) an initial value (INIT) from calibration data CAL 3 and adding (via addition component 304-1) the resulting value to calibration data CAL1. For some embodiments, the polarity of the calibration loop is inverted for calibration data CAL3 relative to calibration data CAL0 and calibration data CAL1 (as increasing the delay of the clock signal 1 and clock signal 3 increases the duty cycle).

Figure 4:
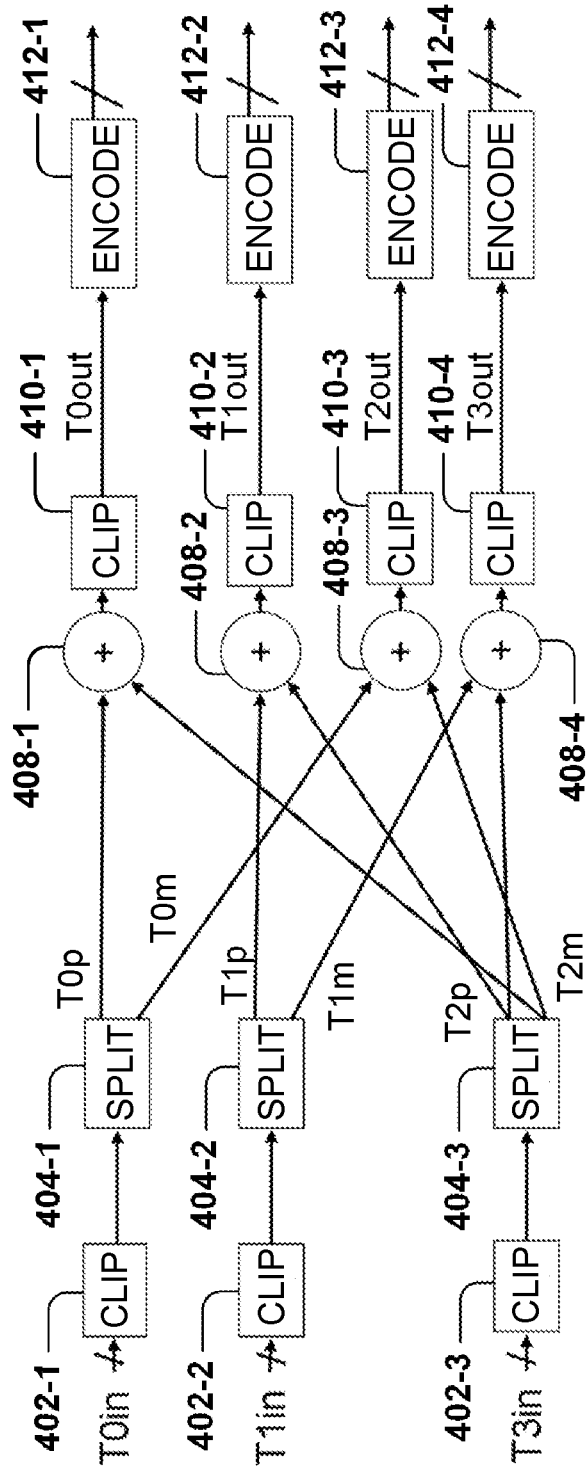
FIG. 4 is a block diagram illustrating an example of generating calibration data for adjusting delays of a plurality of clock signals, in accordance with various embodiments.

FIG. 4 is a block diagram illustrating an example of generating calibration data for adjusting delays of a plurality of clock signals, in accordance with various embodiments. For some embodiments, the example (of generating calibration data) illustrated by FIG. 4 can be used as the delay implementation (e.g., as opposed to the example of FIG. 3) to minimize a maximum delay range used to correct random delay variations. In particular, FIG. 4 illustrates generating calibration code for applying delay adjustments to four clock signals facilitated by moving the delay of two clock signals simultaneously by splitting calibration codes. As shown, clipping components 402-1, 402-2, 402-3 are respectively coupled to splitting components 404-1, 404-2, 404-3; adding components 408-1, 408-2, 408-3, 408-4 are coupled to outputs of the splitting components 404-1, 404-2, 404-3; clipping components 410-1, 410-2, 410-3, 410-4 are respectively coupled to the adding components 408-1, 408-2, 408-3, 408-4; and encoders 412-1, 412-2, 412-3, 412-4 are respectively coupled to the clipping components 410-1, 410-2, 410-3, 410-4.

For some embodiments, calibration code T0in represents a calibration code generated (e.g., within the calibrator 104) for adjusting a delay between a first clock signal of the four clock signals and a third clock signal of the four clock signals; calibration code T1in represents a calibration code generated (e.g., within the calibrator 104) for adjusting a delay between a second clock signal of the four clock signals and a fourth clock signal of the four clock signals; and calibration code T3in represents a calibration code generated (e.g., within the calibrator 104) for simultaneously adjusting a delay between the first clock signal and the second clock signal and a delay between the third clock signal and the fourth clock signal.

During operation, the calibration code T0in (for adjusting the delay between the first clock signal and the third clock signal) is clipped by the clipping component 402-1 (e.g., clipped between +/−30) and split by the splitting component 404-1 into calibration code T0$p$ (e.g., corresponding to a plus adjustment in delay) for the first clock signal and into calibration code T0$m$ (e.g., corresponding to a minus adjustment in delay) for the third clock signal. The calibration code T1in (for adjusting the delay between the second clock signal and the fourth clock signal) is clipped by the clipping component 402-2 (e.g., clipped between +/−30) and split by the splitting component 404-2 into calibration code T1$p$ (e.g., corresponding to a plus adjustment in delay) for the second clock signal and into calibration code T1m (e.g., corresponding to a minus adjustment in delay) for the fourth clock signal. The calibration code T3in (for simultaneously adjusting the delay between the first and second clock signals and the delay between the third and fourth clock signals) is clipped by the clipping component 402-3 (e.g., clipped between +/−30) and split by the splitting component 404-3 into calibration code T2$p$ (e.g., corresponding to a plus adjustment in delay) for the second clock signal and the fourth clock signal, and into calibration code T2$m$ (e.g., corresponding to a minus adjustment in delay) for the first clock signal and the third clock signal.

The adding component 408-1 adds together the calibration code T0$p$ and the calibration code T2$m$ for the first clock signal, and the calibration code that results (from the adding component 408-1) is clipped by the clipping component 410-1, encoded by the encoder 412-1, and outputted to a delay adjuster that receives and adjusts the delay of the first clock signal. The adding component 408-2 adds together the calibration code T1$p$ and the calibration code T2$p$ for the second clock signal, and the calibration code that results (from the adding component 408-2) is clipped by the clipping component 410-2, encoded by the encoder 412-2, and outputted to a delay adjuster that receives and adjusts the delay of the second clock signal. The adding component 408-3 adds together the calibration code T0$m$ and the calibration code T2$m$ for the third clock signal, and the calibration code that results (from the adding component 408-3) is clipped by the clipping component 410-3, encoded by the encoder 412-3, and outputted to a delay adjuster that receives and adjusts the delay of the third clock signal. The adding component 408-4 adds together the calibration code T1m and the calibration code T2$p$ for the fourth clock signal, and the calibration code that results (from the adding component 408-4) is clipped by the clipping component 410-4, encoded by the encoder 412-4, and outputted to a delay adjuster that receives and adjusts the delay of the fourth clock signal.

As described herein, splitting calibration codes in this manner in some embodiments can adjust the delay between two clock signals by spreading the adjustment to the two clock signals.

Figure 5:
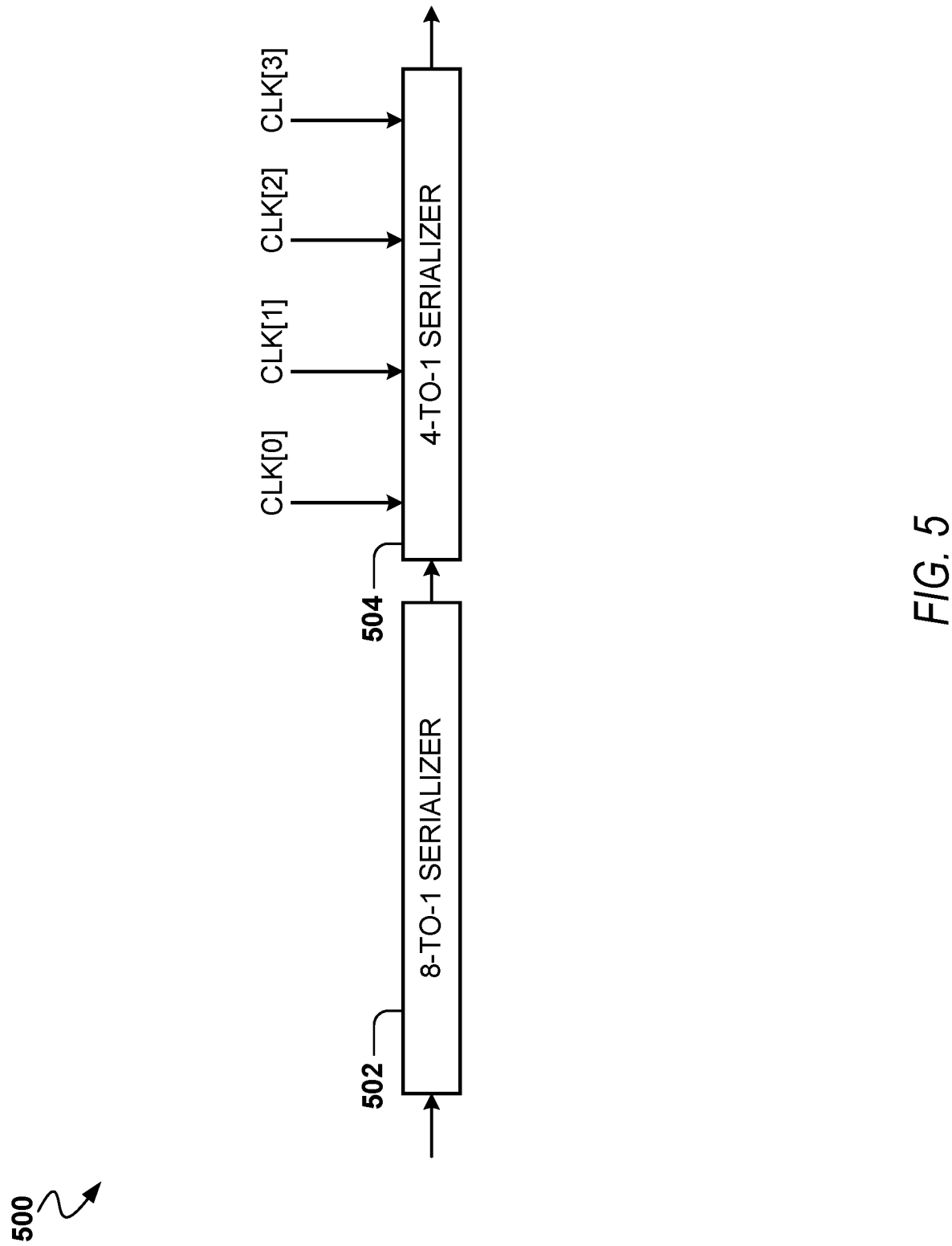
FIG. 5 is a block diagram illustrating an example serializer, in accordance with some embodiments.

FIG. 5 is a block diagram illustrating an example serializer 500, in accordance with some embodiments. As shown, the serializer 500 is configured to operate based on four clock signals (CLK0, CLK1, CLK2, CLK3), such as four quarter-rate clock signals. For some embodiments, the serializer 500 receives as input (via a parallel input interface) parallel digital data having a data width of 32-bits, and converts the parallel digital data into serialized digital data having a data width of 1-bit (outputted via a serial data output interface). As shown, the serializer 500 comprises an 8-to-1 serializer 502, and a 4-to-1 serializer 504 coupled to an output of the 8-to-1 serializer 502, where the 4-to-1 serializer 504 receives the four clock signals.

Figure 6:
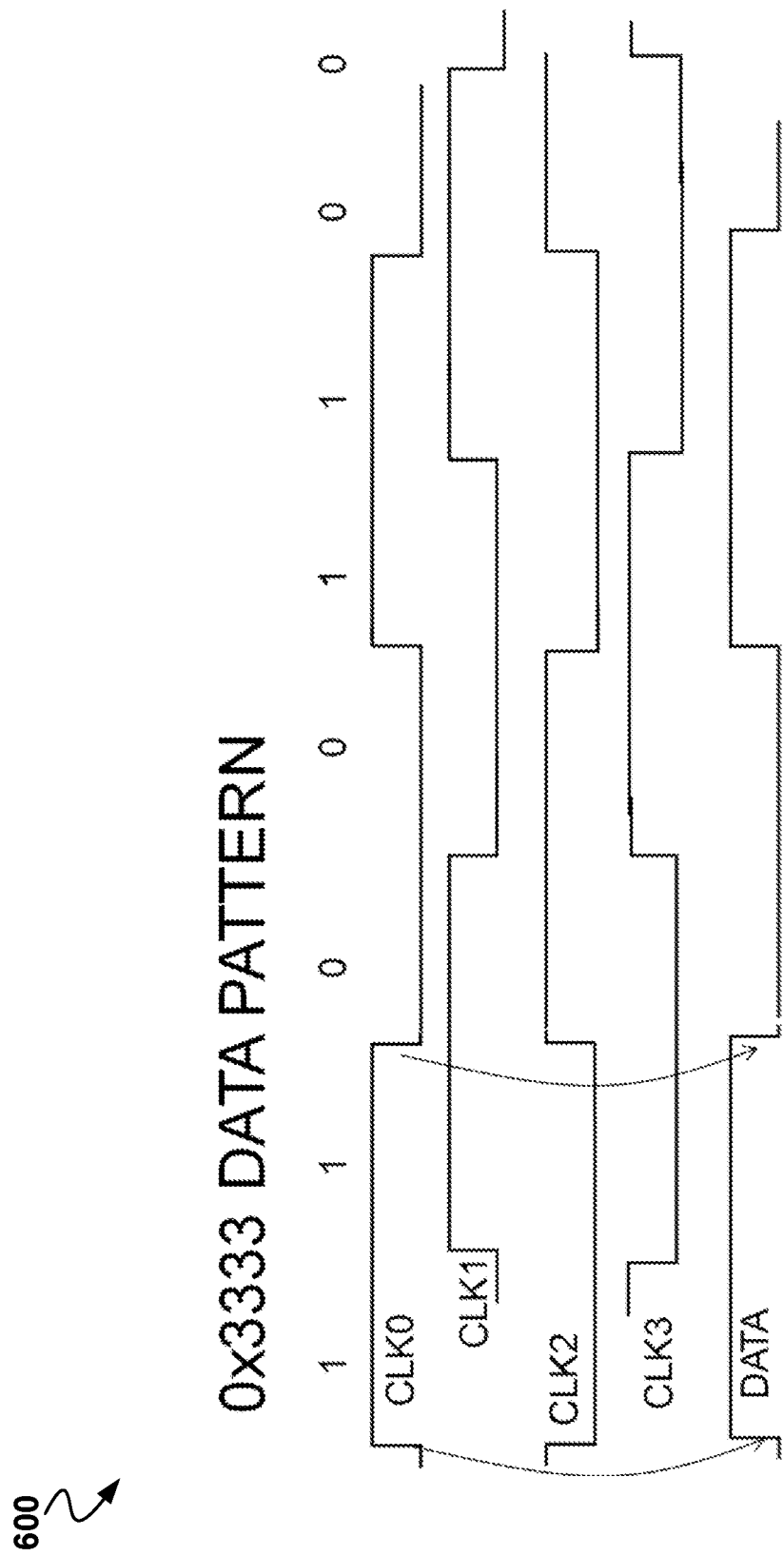
FIGS. 6 through 9 are diagrams illustrating adjustments to duty cycles of clock signals based on generated data patterns, in accordance with some embodiments.

FIGS. 6 through 9 are diagrams illustrating adjustments to duty cycles of clock signals based on generated data patterns, in accordance with some embodiments. In particular, during a first phase of a duty cycle calibration process being performed with respect to four clock signals, graph 600 of FIG. 6 illustrates adjustment to the duty cycle of clock signal 0 (CLK0) while a data pattern comprising 0x3333 is generated (e.g., by the digital data generator 110) and received by a serializer (e.g., 112) that is operating based on (e.g., clocked by) the four clock signals. According to various embodiments, the data pattern (of 0x3333) causes the clock signal 0 to be outputted by the serializer. As shown, the rising edge of the clock signal 0 generates a rising edge in the data outputted by the serializer, and the falling edge of the clock signal 0 generates a falling edge in the data outputted by the serializer.

Figure 7:
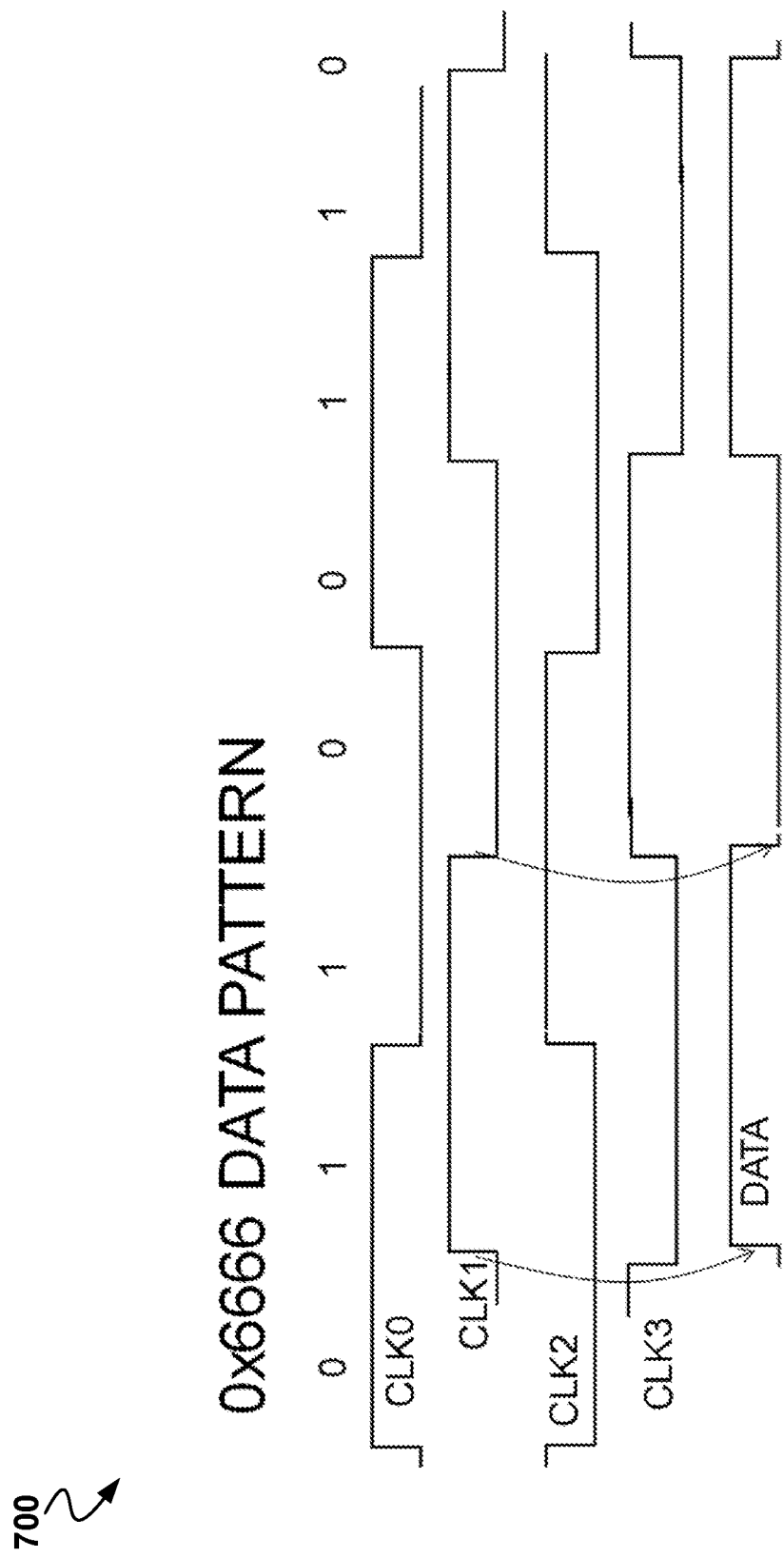

Referring now to graph 700 of FIG. 7, during a second phase of a duty cycle calibration process being performed with respect to four clock signals, an adjustment to the duty cycle of clock signal 1 (CLK1) is performed while a data pattern comprising 0x6666 is generated (e.g., by the digital data generator 110) and received by a serializer (e.g., 112) that is operating based on (e.g., clocked by) the four clock signals. According to various embodiments, the data pattern (of 0x6666) causes the clock signal 1 to be outputted by the serializer. As shown, the rising edge of the clock signal 1 generates a rising edge in the data outputted by the serializer, and the falling edge of the clock signal 1 generates a falling edge in the data outputted by the serializer.

Figure 8:
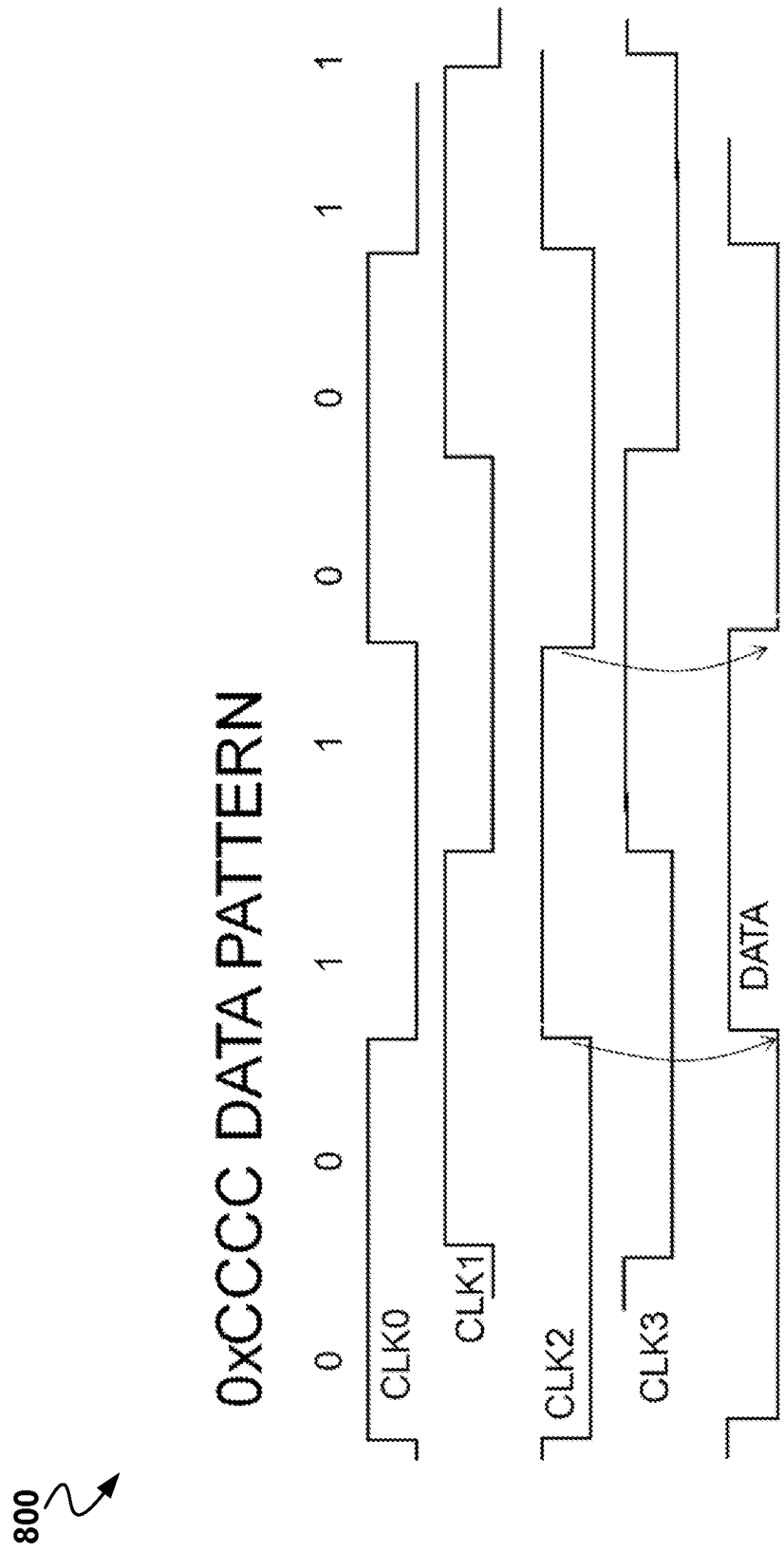

Referring now to graph 800 of FIG. 8, during a third phase of a duty cycle calibration process being performed with respect to four clock signals, an adjustment to the duty cycle of clock signal 2 (CLK2) is performed while a data pattern comprising 0xCCCC is generated (e.g., by the digital data generator 110) and received by a serializer (e.g., 112) that is operating based on (e.g., clocked by) the four clock signals. According to various embodiments, the data pattern (of 0xCCCC) causes the clock signal 2 to be outputted by the serializer. As shown, the rising edge of the clock signal 2 generates a rising edge in the data outputted by the serializer, and the falling edge of the clock signal 2 generates a falling edge in the data outputted by the serializer.

Figure 9:
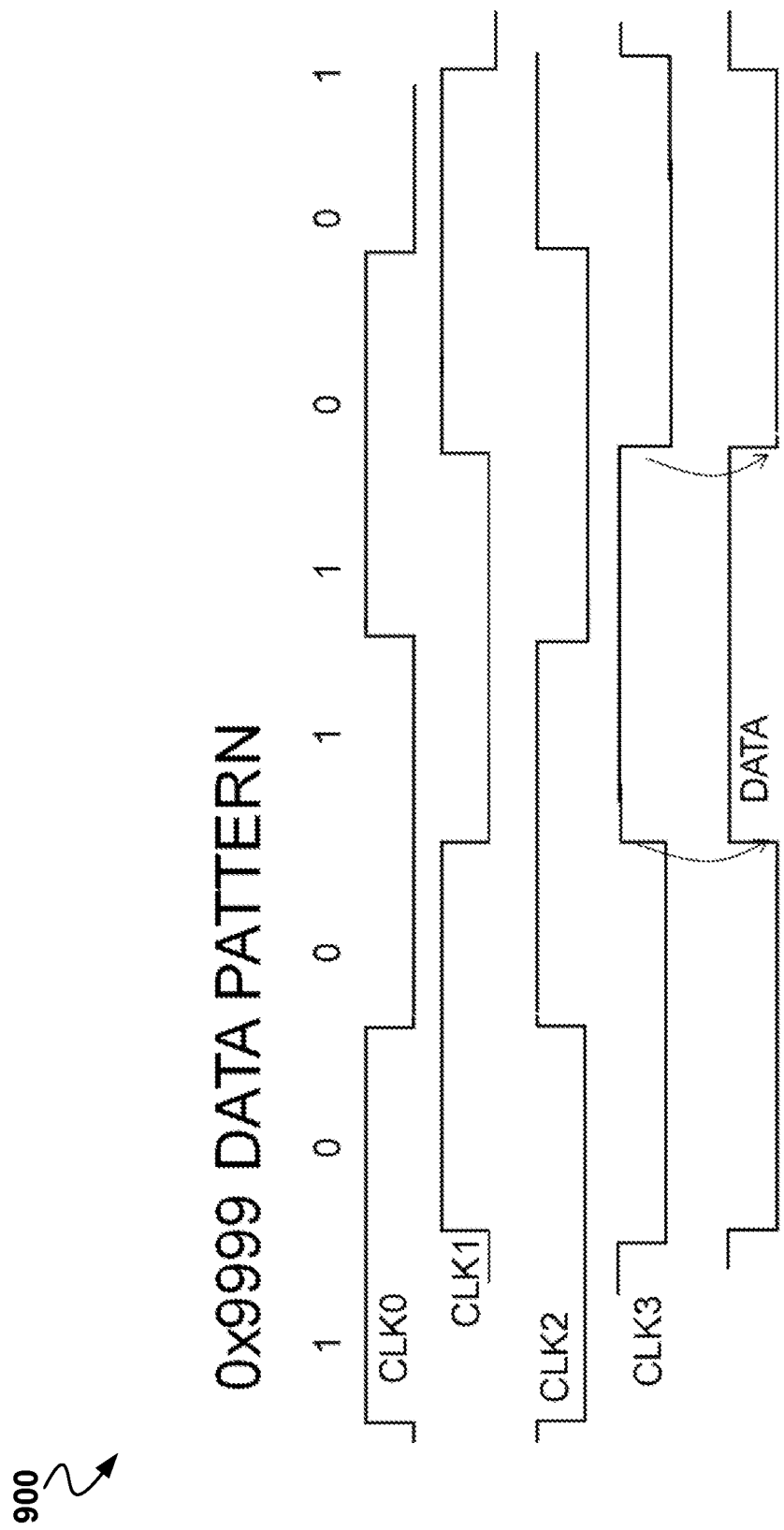

Referring now to graph 900 of FIG. 9, during a third phase of a duty cycle calibration process being performed with respect to four clock signals, an adjustment to the duty cycle of clock signal 3 (CLK3) is performed while a data pattern comprising 0x9999 is generated (e.g., by the digital data generator 110) and received by a serializer (e.g., 112) that is operating based on (e.g., clocked by) the four clock signals. According to various embodiments, the data pattern (of 0x9999) causes the clock signal 3 to be outputted by the serializer. As shown, the rising edge of the clock signal 3 generates a rising edge in the data outputted by the serializer, and the falling edge of the clock signal 3 generates a falling edge in the data outputted by the serializer.

Figure 10:
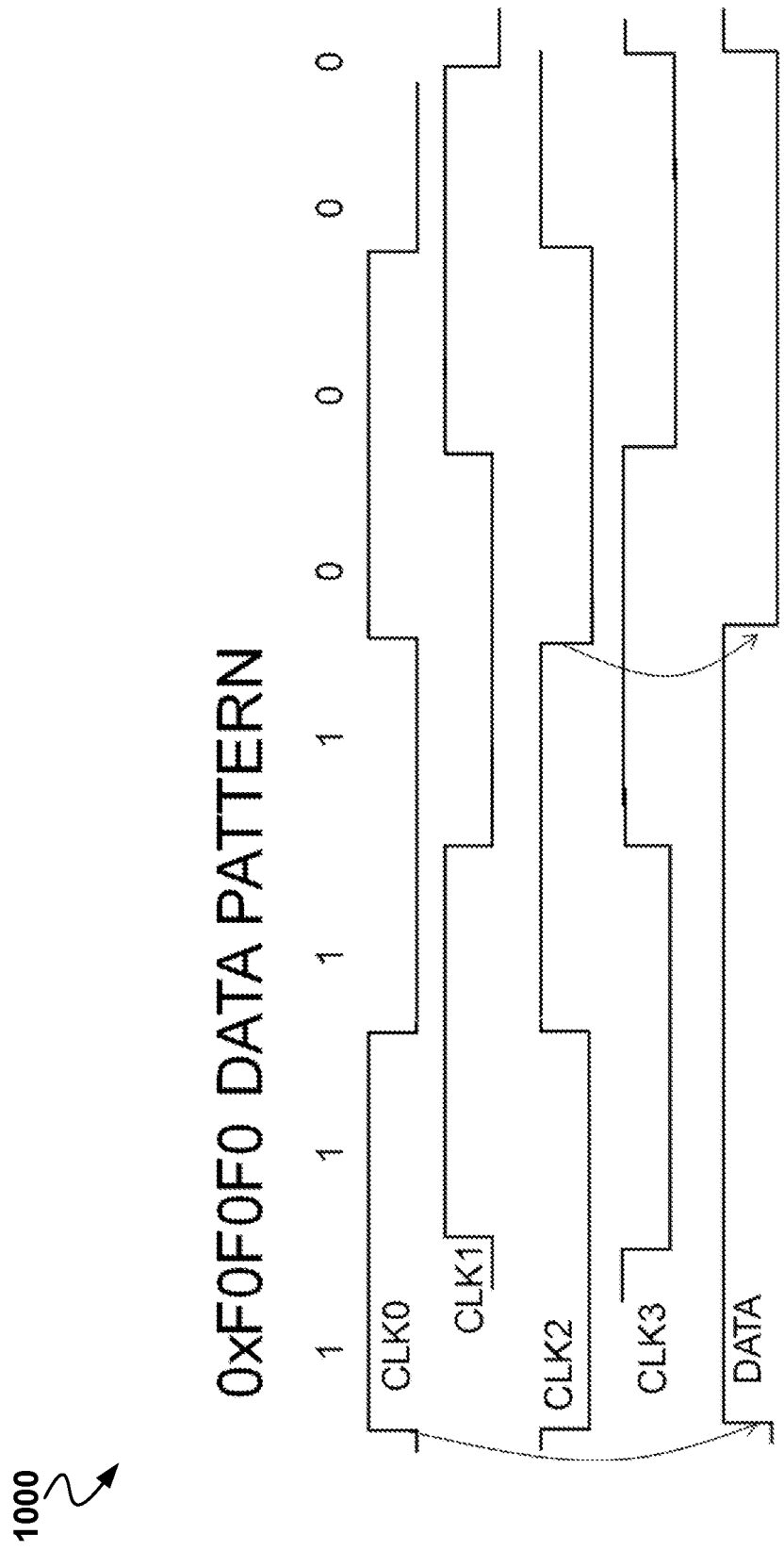
FIGS. 10 through 13 are diagrams illustrating adjustments to delays of clock signals based on generated data patterns, in accordance with some embodiments.

FIGS. 10 through 13 are diagrams illustrating adjustments to delays of clock signals based on generated data patterns, in accordance with some embodiments. In particular, during a first phase of a delay calibration process being performed with respect to four clock signals, graph 1000 of FIG. 10 illustrates adjustment to the delay between clock signal 0 (CLK0) and clock signal 2 (CLK2) while a data pattern comprising 0xF0F0F0 is generated (e.g., by the digital data generator 110) and received by a serializer (e.g., 112) that is operating based on (e.g., clocked by) the four clock signals. According to various embodiments, the data pattern (of 0xF0F0F0) causes the clock signal 0 and the clock signal 2 to be outputted by the serializer. During the first phase, the rising edge of the clock signal 0 can be calibrated with the falling edge of the clock signal 2.

Figure 11:
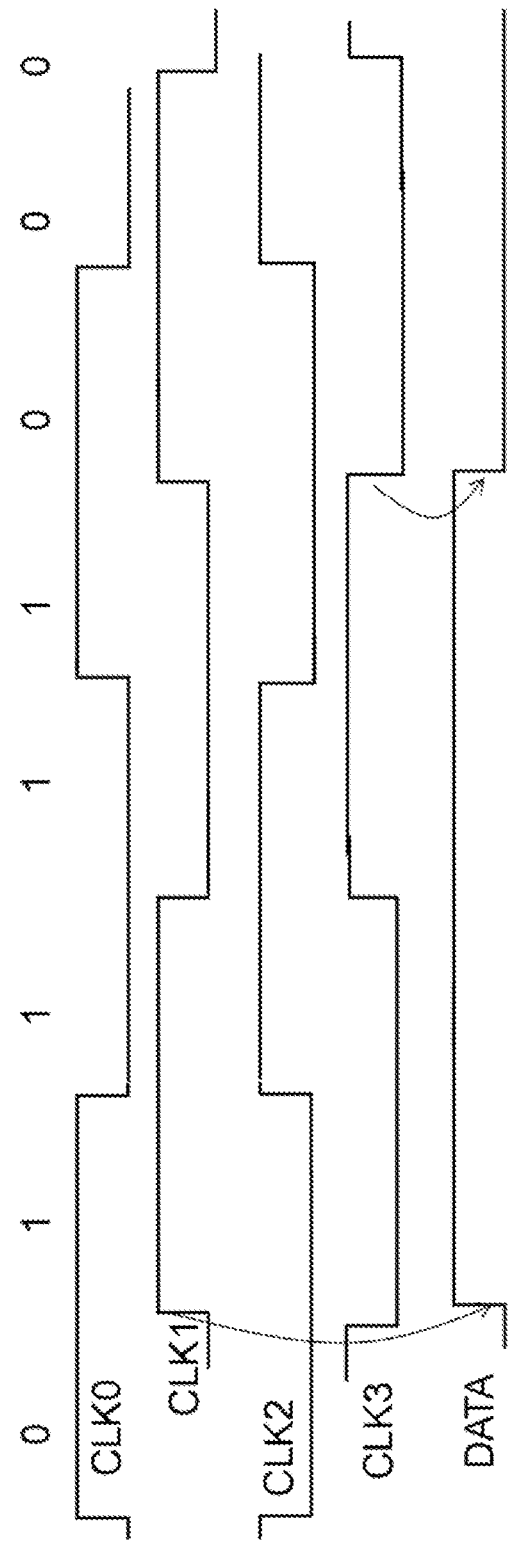

Referring now to graph 1100 of FIG. 11, during a second phase of a delay calibration process being performed with respect to four clock signals, an adjustment to the delay between clock signal 1 (CLK1) and clock signal 3 (CLK3) while a data pattern comprising 0xE1E1E1 is generated (e.g., by the digital data generator 110) and received by a serializer (e.g., 112) that is operating based on (e.g., clocked by) the four clock signals. According to various embodiments, the data pattern (of 0xE1E1E1) causes the clock signal 1 and the clock signal 3 to be outputted by the serializer. During the second phase, the rising edge of the clock signal 1 can be calibrated with the falling edge of the clock signal 3.

Figure 12:
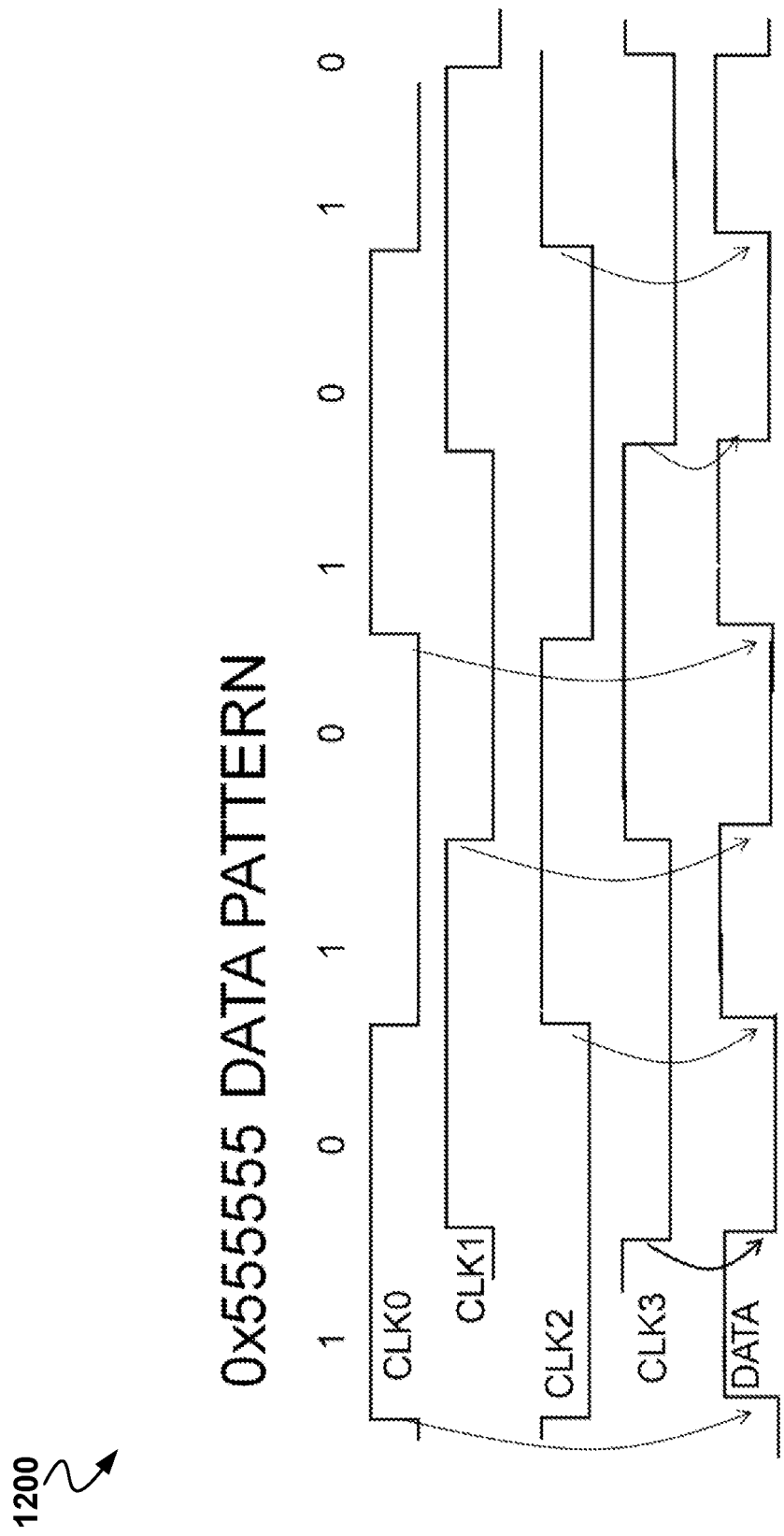

Referring now to graph 1200 of FIG. 12, during a third phase of a delay calibration process being performed with respect to four clock signals, a simultaneous adjustment to the delay between clock signal 0 (CLK0) and clock signal 1 (CLK1) and to the delay between clock signal 2 (CLK2) and clock signal 3 (CLK3), while a data pattern comprising 0x555555 is generated (e.g., by the digital data generator 110) and received by a serializer (e.g., 112) that is operating based on (e.g., clocked by) the four clock signals. According to various embodiments, the data pattern (of 0x555555) causes the clock signal 0, the clock signal 1, the clock signal 2, and the clock signal 3 to be outputted by the serializer. During the third phase, clock signal 1 is calibrated to clock signal 0, and clock signal 3 is calibrated to clock signal 2.

Figure 13:
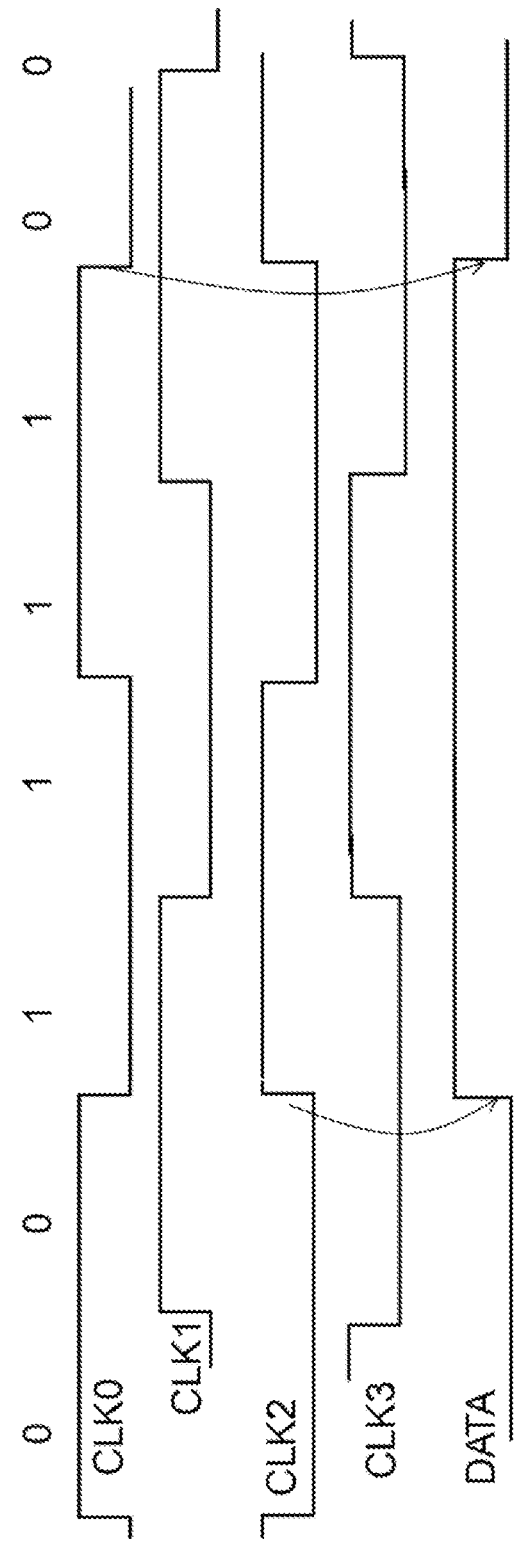

Referring now to graph 1300 of FIG. 13, for some embodiments, a data pattern comprising 0x3C3C3C can be used to calibrate clock signal 2 (CLK2) to clock signal 0 (CLK0). Depending on the embodiment, calibration of clock signal 2 and clock signal 0 using the 0x3C3C3C data pattern can be redundant in view of the calibration of clock signal 0 to clock signal 2 in accordance with FIG. 10.

For some embodiments, calibration of four clock signals that drive (e.g., clock) a serializer comprises: adjusting (e.g., calibrating) the duty cycle of each of the four clock signals over four phases according to FIGS. 6 through 9; and thereafter, adjusting relative delays between the four clock signals over three phases according to FIGS. 10 through 12. Where there is a single clock signal driving a serializer, calibration can comprise adjusting a duty cycle of the single clock signal and no delay adjustment to the single clock signal. Where there is two clock signals, the calibration can comprise adjusting the duty cycle of each of the clock signals over two phases, and then adjusting a delay between the two clock signals.

Figure 14:
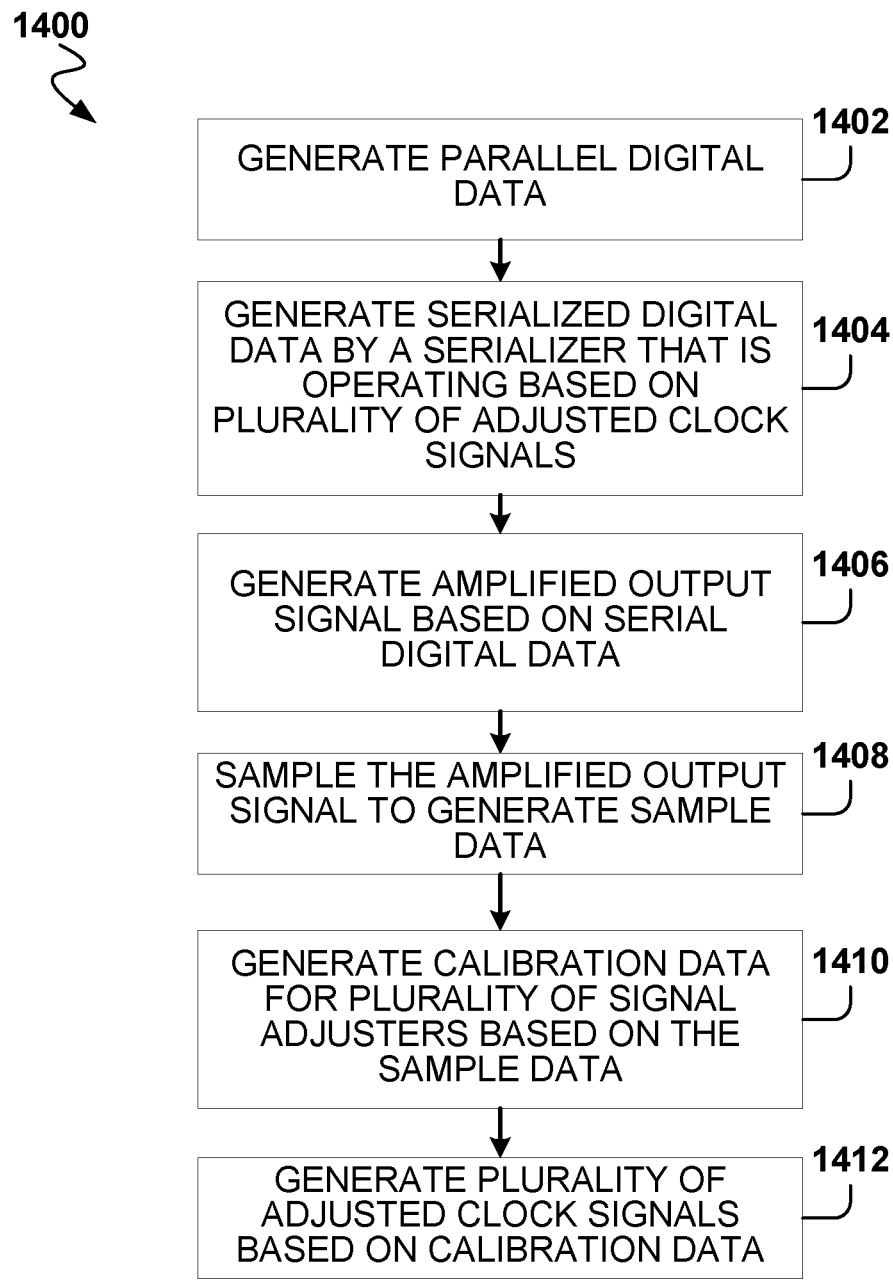
FIG. 14 is a flowchart illustrating an example method for clock calibration for a serializer, in accordance with some embodiments.

FIG. 14 is a flowchart illustrating an example method 1400 for clock calibration for a serializer, in accordance with some embodiments. Some or all of the method 1400 can be performed by a circuit such as the circuit 100 described herein with respect with FIG. 1. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

In FIG. 14, the method 1400 begins with operation 1402, where a digital data generator (e.g., 110) generates parallel digital data. For some embodiments, when adjusting one or more clock signals (e.g., during a calibration of quarter-rate clock signals) that are provided to a serializer (e.g., 112), the parallel digital data generated by the digital data generator comprises a specific data pattern to facilitate one or more adjustments via a plurality of signal adjusters (e.g., 106, 108).

At operation 1404, a serializer (e.g., 112) generates serialized digital data based on the parallel digital data (generated by operation 1402) and a plurality of adjusted clock signals.

At operation 1406, a driver (e.g., 114) generates an amplified output signal based on the serial digital data (generated by operation 1404).

At operation 1408, a data sampler samples the amplified output signal (generated by operation 1406) to generate sample data. For some embodiments, the data sampler operates based on an asynchronous clock signal that is asynchronous with respect to each of the plurality of clock signals.

At operation 1410, a clock calibrator generates calibration data for a plurality of signal adjusters based on the sample data (generated by operation 1408).

At operation 1412, a plurality of signal adjusters generate the plurality of adjusted clock signals (e.g., provided to the serializer 112) based on a plurality of clock signals and the calibration data. For some embodiments, operation 1412 comprises adjusting at least one signal adjuster (e.g., a duty cycle adjuster) of the plurality of signal adjusters and a duty cycle of at least one clock signal of the plurality of clock signals based on the calibration data. Additionally, for some embodiments, operation 1412 comprises adjusting at least one signal adjuster (e.g., a delay adjuster) of the plurality of signal adjusters and a delay of at least one clock signal of the plurality of clock signals based on the calibration data.

Figure 15:
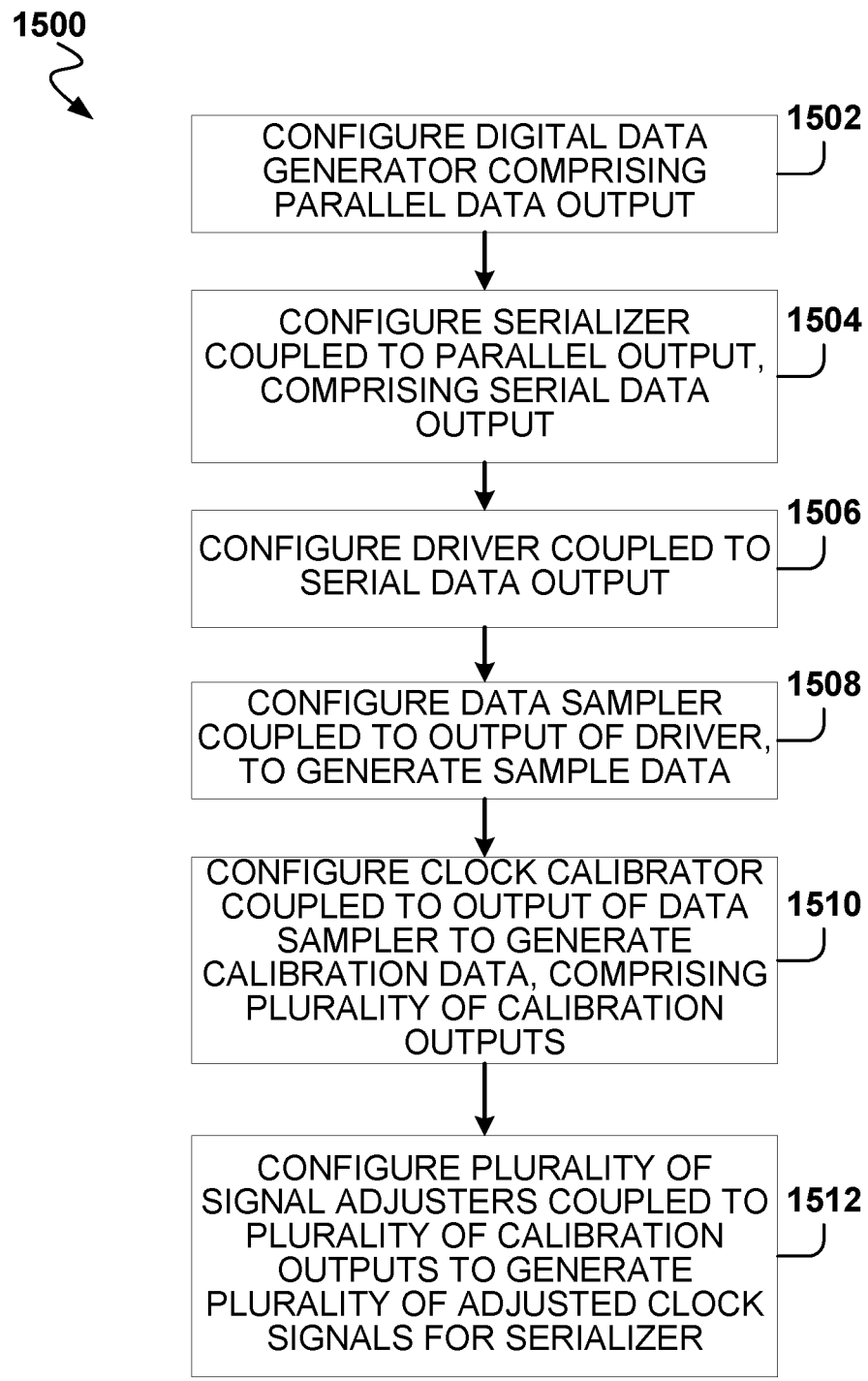
FIG. 15 is a flowchart illustrating an example method for generating a circuit design including clock calibration for a serializer, in accordance with some embodiments.

FIG. 15 is a flowchart illustrating an example method 1500 for generating a circuit design including clock calibration for a serializer, in accordance with some embodiments. It will be understood that the method 1500 can be performed by a device, such as a computing device executing instructions of an EDA software system, in accordance with some embodiments. Additionally, the method 1500 herein can be implemented in the form of executable instructions stored on a computer-readable medium or in the form of electronic circuitry. For instance, the operations of the method 1500 may be represented by executable instructions that, when executed by a processor of a computing device, cause the computing device to perform the method 1500. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

In FIG. 15, the method 1500 begins with operation 1502, where a digital data generator (e.g., 110) that comprises a parallel data output is configured within a circuit design, where the parallel data output is configured to provide parallel digital data generated by the digital data generator.

At operation 1504, a serializer (e.g., 112) is configured within the circuit design, where the serializer is coupled to the parallel data output of the digital data generator, and the serializer comprises a serial data output that is configured to provide serialized digital data. For various embodiments, the serialized digital data is generated by the serializer based on the parallel digital data (from the digital data generator) and a plurality of adjusted clock signals. At operation 1506, a driver (e.g., 114) is configured within the circuit design, where driver is coupled to the serial data output, and the driver is configured to generate an amplified output signal based on the serial digital data (from the serializer). At operation 1508, a data sampler (e.g., 118) is configured within the circuit design, where the data sampler is coupled to an output of the driver, and the data sampler is configured to generate sample data by sampling the amplified output signal (from the driver). At operation 1510, a clock calibrator (e.g., 104) is configured within the circuit design, where the clock calibrator is coupled to an output of the data sampler, the clock calibrator is configured to generate calibration data for a plurality of signal adjusters based on the sample data, and the clock calibrator comprises a plurality of calibration outputs. At operation 1512, the plurality of signal adjusters (e.g., 106, 108) are configured within the circuit design, where the plurality of signal adjusters is coupled to the plurality of calibration outputs (of the clock calibrator). For various embodiments, the plurality of signal adjusters is configured to generate the plurality of adjusted clock signals based on a plurality of clock signals and the calibration data (from the clock calibrator). In particular, each individual signal adjuster (e.g., 106-1, 106-2, 106-3, 106-4, 108-1, 108-2, 108-3, 108-4) of the plurality of signal adjusters (e.g., 106, 108) can be configured to: receive a different clock signal of the plurality of clock signals; receive a calibration data portion, of the calibration data, associated with the individual signal adjuster from at least one of the plurality of calibration outputs; and generate one of the plurality of adjusted clock signals by adjusting the different clock signal based on the received calibration data portion.

Figure 16:
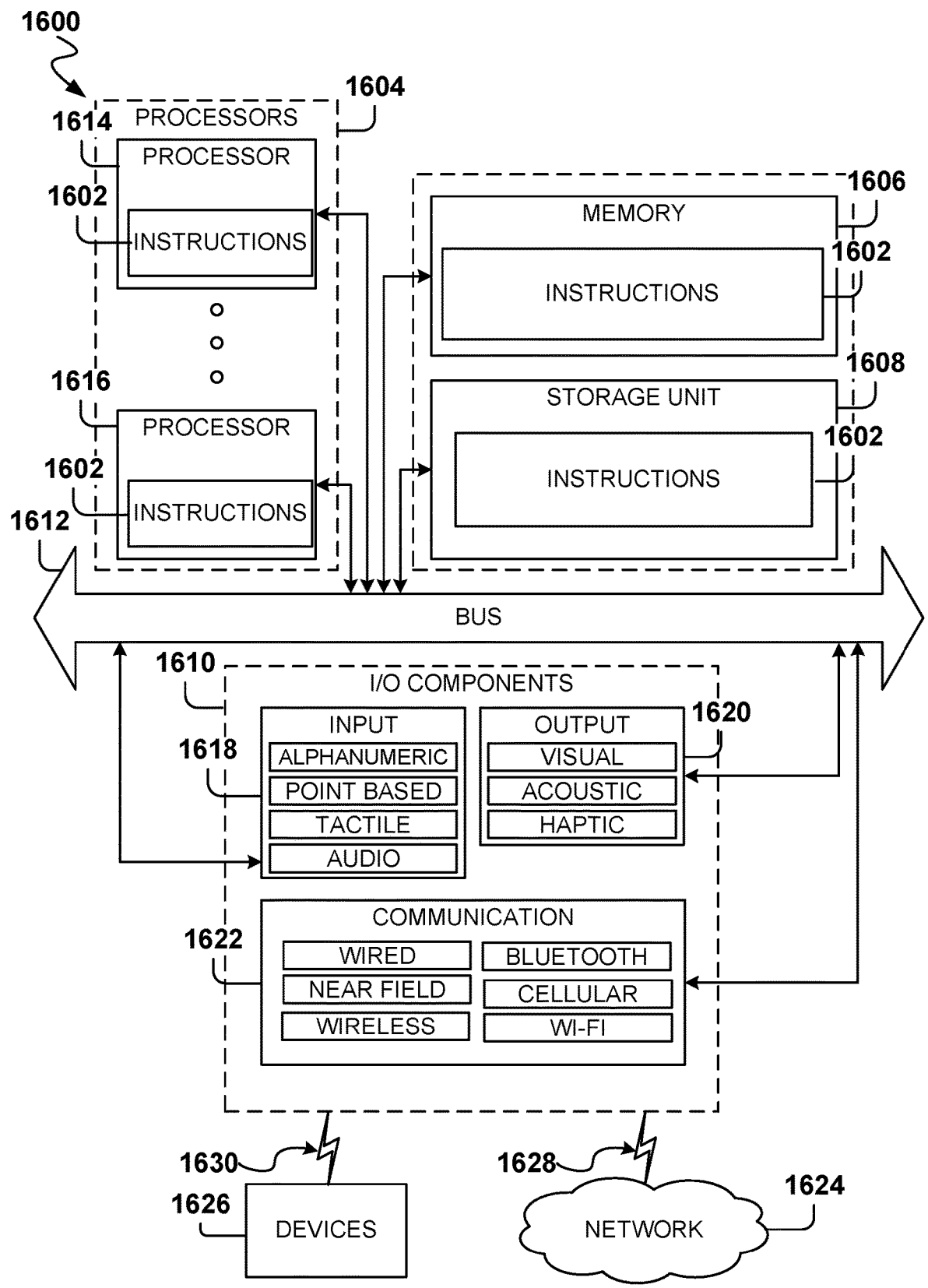
FIG. 16 is a block diagram illustrating components of a machine, according to some example embodiments, able to read instructions from a machine-readable medium and perform any one or more of the methodologies discussed herein.

FIG. 16 is a block diagram illustrating components of a machine 1600, according to some example embodiments, able to read instructions from a machine-readable medium (e.g., a machine-readable storage medium) and perform any one or more of the methodologies discussed herein. Specifically, FIG. 16 shows a diagrammatic representation of the machine 1600 in the example form of a system within which instructions 1602 (e.g., software, a program, an application, an applet, an app, a driver, or other executable code) for causing the machine 1600 to perform any one or more of the methodologies discussed herein may be executed. For example, the instructions 1602 include executable code that causes the machine 1600 to execute the method 1500 described with respect to FIG. 15. In this way, these instructions 1602 transform the general, non-programmed machine 1600 into a particular machine programmed to carry out the described and illustrated method 1500 in the manner described herein. The machine 1600 may operate as a standalone device or may be coupled (e.g., networked) to other machines.

By way of non-limiting example, the machine 1600 may comprise or correspond to a television, a computer (e.g., a server computer, a client computer, a personal computer (PC), a tablet computer, a laptop computer, or a netbook), a personal digital assistant (PDA), a smart phone, a mobile device, or any machine capable of executing the instructions 1602, sequentially or otherwise, that specify actions to be taken by the machine 1600. Further, while only a single machine 1600 is illustrated, the term "machine" shall also be taken to include a collection of machines 1600 that individually or jointly execute the instructions 1602 to perform any one or more of the methodologies discussed herein.

The machine 1600 may include processors 1604, memory 1606, a storage unit 1608, and I/O components 1610, which may be configured to communicate with each other such as via a bus 1612. In an example embodiment, the processors 1604 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 1614 and a processor 1616 that may execute the instructions 1602. The term "processor" is intended to include multi-core processors 1604 that may comprise two or more independent processors (sometimes referred to as "cores") that may execute instructions 1602 contemporaneously. Although FIG. 16 shows multiple processors 1604, the machine 1600 may include a single processor with a single core, a single processor with multiple cores (e.g., a multi-core processor), multiple processors with a single core, multiple processors with multiple cores, or any combination thereof.

The memory 1606 (e.g., a main memory or other memory storage) and the storage unit 1608 are both accessible to the processors 1604 such as via the bus 1612. The memory 1606 and the storage unit 1608 store the instructions 1602 embodying any one or more of the methodologies or functions described herein. The instructions 1602 may also reside, completely or partially, within the memory 1606, within the storage unit 1608, within at least one of the processors 1604 (e.g., within the processor's cache memory), or any suitable combination thereof, during execution thereof by the machine 1600. Accordingly, the memory 1606, the storage unit 1608, and the memory of the processors 1604 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM), and/or any suitable combination thereof. The term "machine-readable medium" should be taken to include a single medium or multiple media (e.g., a centralized or distributed database, or associated caches and servers) able to store the instructions 1602. The term "machine-readable medium" shall also be taken to include any medium, or combination of multiple media, that is capable of storing instructions (e.g., instructions 1602) for execution by a machine (e.g., machine 1600), such that the instructions, when executed by one or more processors of the machine (e.g., processors 1604), cause the machine to perform any one or more of the methodologies described herein (e.g., method 1500). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 1610 may include a wide variety of components to receive input, provide output, produce output, transmit information, exchange information, capture measurements, and so on. The specific I/O components 1610 that are included in a particular machine 1600 will depend on the type of the machine 1600. For example, portable machines such as mobile phones will likely include a touch input device or other such input mechanisms, while a headless server machine will likely not include such a touch input device. It will be appreciated that the I/O components 1610 may include many other components that are not specifically shown in FIG. 16. The I/O components 1610 are grouped according to functionality merely for simplifying the following discussion and the grouping is in no way limiting. In various example embodiments, the I/O components 1610 may include input components 1618 and output components 1620. The input components 1618 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 1620 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 1610 may include communication components 1622 operable to couple the machine 1600 to a network 1624 or devices 1626 via a coupling 1628 and a coupling 1630 respectively. For example, the communication components 1622 may include a network interface component or another suitable device to interface with the network 1624. In further examples, the communication components 1622 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 1626 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 17:
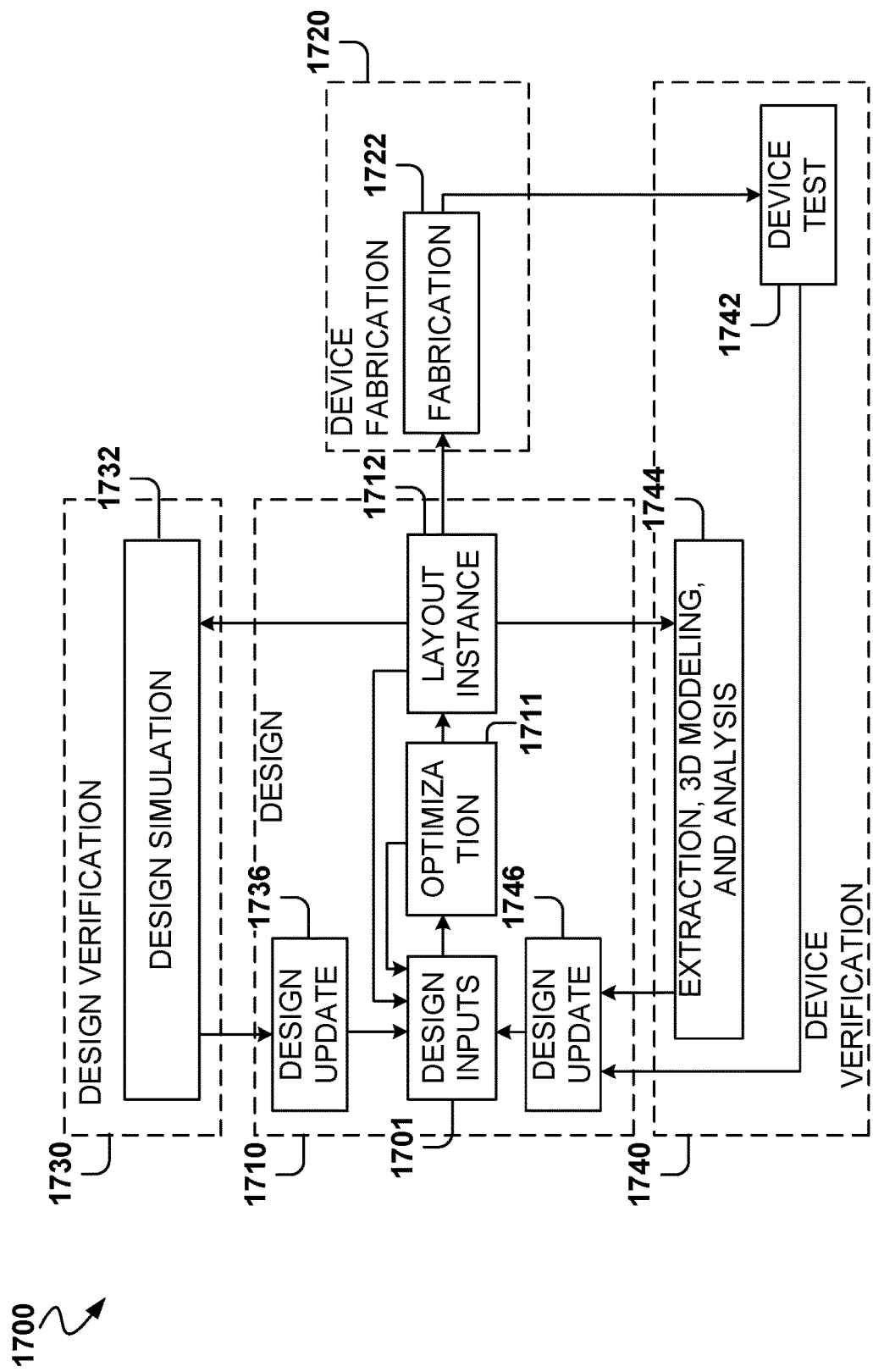
FIG. 17 is a diagram illustrating one possible design process flow for generating a circuit, including embodiments to implement clock calibration for a serializer as described herein, and in various embodiments, to integrate the clock calibration with a larger circuit.

FIG. 17 is a diagram illustrating one possible design process flow for generating a circuit, including embodiments to implement clock calibration for a serializer as described herein, and in various embodiments, to integrate the clock calibration with a larger circuit (e.g., SerDes circuit). As illustrated, the overall design flow 1700 includes a design phase 1710, a device fabrication phase 1720, a design verification phase 1730, and a device verification phase

1740. The design phase 1710 involves an initial design input operation 1701 where the basic elements and functionality of a device are determined, as well as revisions based on various analyses and optimization of a circuit design. This design input operation 1701 is where instances of an EDA circuit design file are used in the design and any additional circuitry is selected. The initial strategy, tactics, and context for the device to be created are also generated in the design input operation 1701, depending on the particular design algorithm to be used.

In some embodiments, following an initial selection of design values in the design input operation 1701, timing analysis and optimization according to various embodiments occurs in an optimization operation 1711, along with any other automated design processes. One such process may be the automated design of a partitioned root search for error locator polynomial functions in RS FEC decoding. As described below, design constraints for blocks of a circuit design generated with design inputs in the design input operation 1701 may be analyzed using hierarchical timing analysis, according to various embodiments. While the design flow 1700 shows such optimization occurring prior to a layout instance 1712, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 1722.

After design inputs are used in the design input operation 1701 to generate a circuit layout, and any optimization operations 1711 are performed, a layout is generated in the layout instance 1712. The layout describes the physical layout dimensions of the device that match the design inputs. This layout may then be used in the device fabrication operation 1722 to generate a device, or additional testing and design updates may be performed using designer inputs or automated updates based on design simulation 1732 operations or extraction, 3D modeling, and analysis 1744 operations. Once the device is generated, the device can be tested as part of device test 1742 operations, and layout modifications generated based on actual device performance.

As described in more detail below, design updates 1736 from the design simulation 1732, design updates 1746 from the device test 1742, the 3D modeling and analysis 1744 operations, or the design input operation 1701 may occur after an initial layout instance 1712 is generated. In various embodiments, whenever design inputs are used to update or change an aspect of a circuit design, a timing analysis and optimization operation 1711 may be performed.

For example, in various embodiments, a user may provide an input to a computing device indicating placement of elements of a circuit within a first portion of a circuit design, including description of circuitry for a multi-channel memory interface described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
a digital data generator comprising a parallel data output to provide parallel digital data generated by the digital data generator;
a serializer coupled to the parallel data output, the serializer comprising a serial data output to provide serialized digital data, the serialized digital data being generated by the serializer based on the parallel digital data and a plurality of adjusted clock signals;
a data sampler coupled to the serial data output, the data sampler configured to generate sample data by sampling the serialized digital data;
a clock calibrator coupled to an output of the data sampler, the clock calibrator being configured to generate calibration data for a plurality of signal adjusters based on the sample data, and the clock calibrator comprising a plurality of calibration outputs; and
the plurality of signal adjusters coupled to the plurality of calibration outputs, the plurality of signal adjusters being configured to generate the plurality of adjusted clock signals based on a plurality of clock signals and the calibration data, each individual signal adjuster of the plurality of signal adjusters being configured to:
receive a different clock signal of the plurality of clock signals;
receive a calibration data portion, of the calibration data, associated with the individual signal adjuster from at least one of the plurality of calibration outputs; and
generate one of the plurality of adjusted clock signals by adjusting the different clock signal based on the received calibration data portion.

2. The circuit of claim 1, wherein the data sampler operates based on an asynchronous clock signal that is asynchronous with respect to each of the plurality of clock signals.

3. The circuit of claim 2, wherein the asynchronous clock signal has a frequency that is different from the plurality of clock signals.

4. The circuit of claim 1, wherein the adjusting the different clock signal based on the received calibration data portion comprises:
adjusting a duty cycle of the different clock signal based on the received calibration data portion.

5. The circuit of claim 4, wherein the individual signal adjuster comprises:
a duty cycle adjuster to adjust the duty cycle of the different clock signal based on the received calibration data portion.

6. The circuit of claim 1, wherein the adjusting the different clock signal based on the received calibration data portion comprises:
adjusting a delay of the different clock signal based on the received calibration data portion.

7. The circuit of claim 6, wherein the individual signal adjuster comprises:
a delay adjuster to adjust the delay of the different clock signal based on the received calibration data portion.

8. The circuit of claim 1, wherein the calibration data portion comprises at least one of a first data portion for adjusting a duty cycle of the different clock signal and a second data portion for adjusting a delay of the different clock signal.

9. The circuit of claim 1, wherein the parallel digital data comprises a first data pattern during a duty cycle calibration of a first clock signal of the plurality of clock signals, wherein the clock calibrator is configured to generate a first calibration data portion for a first individual signal adjuster of the plurality of signal adjusters during the duty cycle calibration of the first clock signal, and wherein the first individual signal adjuster is configured to adjust a duty cycle of the first clock signal based on the first calibration data portion during the duty cycle calibration of the first clock signal.

10. The circuit of claim 9, wherein the parallel digital data comprises a second data pattern during a duty cycle calibration of a second dock signal of the plurality of clock signals, wherein the clock calibrator is further configured to generate a second calibration data portion for a second individual signal adjuster of the plurality of signal adjusters during the duty cycle calibration of the second clock signal, and wherein the second individual signal adjuster is configured to adjust a duty cycle of the second clock signal based on the second calibration data portion during the duty cycle calibration of the second clock signal.

11. The circuit of claim 9, wherein the duty cycle calibration of the first clock signal has a target duty cycle of 25%, a target duty cycle of 50%, or a target duty cycle of 75%.

12. The circuit of claim 1, wherein the plurality of clock signals comprises quarter-rate clock signals.

13. The circuit of claim 1, wherein the parallel digital data comprises a first data pattern during a delay calibration between a first clock signal of the plurality of clock signals and a second clock signal of the plurality of clock signals, wherein the clock calibrator is configured to generate a first calibration data portion for a first individual signal adjuster of the plurality of signal adjusters during the delay calibration of the first clock signal with the second clock signal, wherein the clock calibrator is further configured to generate a second calibration data portion for a second individual signal adjuster of the plurality of signal adjusters during the delay calibration of the second clock signal with the first clock signal, wherein the first individual signal adjuster is configured to adjust a delay of the first clock signal based on the first calibration data during the delay calibration of the first clock signal, and the second individual signal adjuster is configured to adjust a delay of the second clock signal based on the second calibration data during the delay calibration of the second clock signal.

14. The circuit of claim 13, wherein the first calibration data portion is configured to increase the delay of the first clock signal, and the second calibration data portion is configured to decrease the delay of the second clock signal.

15. The circuit of claim 13, wherein the first calibration data portion is configured to decrease the delay of the first clock signal, and the second calibration data portion is configured to increase the delay of the second clock signal.

16. A method comprising:
generating, by a digital data generator, parallel digital data;
generating serialized digital data by a serializer that is operating based on the parallel digital data and a plurality of adjusted clock signals;
sampling, by a data sampler, the serialized digital data to generate sample data;
generating, by a clock calibrator, calibration data for a plurality of signal adjusters based on the sample data, the clock calibrator comprising a plurality of calibration outputs; and
generating, by the plurality of signal adjusters, the plurality of adjusted clock signals based on a plurality of clock signals and the calibration data, the plurality of signal adjusters being coupled to the plurality of calibration outputs, each individual signal adjuster of the plurality of signal adjusters being configured for:

receiving a different clock signal of the plurality of clock signals;

receiving a calibration data portion, of the calibration data, associated with the individual signal adjuster from at least one of the plurality of calibration outputs; and generating one of the plurality of adjusted clock signals by adjusting the different clock signal based on the received calibration data portion.

17. The method of claim 16, wherein the data sampler operates based on an asynchronous clock signal that is asynchronous with respect to each of the plurality of clock signals.

18. The method of claim 16, wherein the generating the plurality of adjusted clock signals based on the plurality of clock signals and the calibration data comprises:

adjusting at least one signal adjuster of the plurality of signal adjusters by a duty cycle of at least one clock signal of the plurality of clock signals based on the calibration data.

19. The method of claim 16, wherein the generating the plurality of adjusted clock signals based on the plurality of clock signals and the calibration data comprises:

adjusting at least one signal adjuster of the plurality of signal adjusters by a delay of at least one clock signal of the plurality of clock signals based on the calibration data.

20. A non-transitory computer-readable medium comprising instructions that, when executed by one or more processors of a computing device, cause the computing device to generate a circuit design by performing operations comprising:

configuring, in the circuit design, a digital data generator that comprises a parallel data output to provide parallel digital data generated by the digital data generator;

configuring, in the circuit design, a serializer coupled to the parallel data output, the serializer comprising a serial data output to provide serialized digital data, the serialized digital data being generated by the serializer based on the parallel digital data and a plurality of adjusted clock signals;

configuring, in the circuit design, a data sampler coupled to the serial data output, the data sampler configured to generate sample data by sampling the serialized digital data;

configuring, in the circuit design, a clock calibrator coupled to an output of the data sampler, the clock calibrator being configured to generate calibration data for a plurality of signal adjusters based on the sample data, and the clock calibrator comprising a plurality of calibration outputs; and configuring, in the circuit design, the plurality of signal adjusters coupled to the plurality of calibration outputs, the plurality of signal adjusters being configured to generate the plurality of adjusted clock signals based on a plurality of clock signals and the calibration data, each individual signal adjuster of the plurality of signal adjusters being configured to:

receive a different clock signal of the plurality of clock signals;

receive a calibration data portion, of the calibration data, associated with the individual signal adjuster from at least one of the plurality of calibration outputs; and generate one of the plurality of adjusted clock signals by adjusting the different clock signal based on the received calibration data portion.

* * * * *